United States Patent
Horio et al.

(10) Patent No.: US 10,288,773 B2
(45) Date of Patent: May 14, 2019

(54) LAYERED BODY FOR OPTICAL MEMBER AND IMAGE DISPLAY DEVICE

(71) Applicant: DAI NIPPON PRINTING CO., LTD., Tokyo (JP)

(72) Inventors: Tomoyuki Horio, Tokyo (JP); Masataka Nakashima, Tokyo (JP); Hiroshi Nakamura, Tokyo (JP); Jun Sato, Tokyo (JP); Takeshi Nishizono, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 15/505,011

(22) PCT Filed: Jul. 15, 2016

(86) PCT No.: PCT/JP2016/071042
§ 371 (c)(1),
(2) Date: Feb. 17, 2017

(87) PCT Pub. No.: WO2017/014198
PCT Pub. Date: Jan. 26, 2017

(65) Prior Publication Data
US 2017/0276840 A1    Sep. 28, 2017

(30) Foreign Application Priority Data

Jul. 17, 2015  (JP) .................................. 2015-143492
Jul. 17, 2015  (JP) .................................. 2015-143493
(Continued)

(51) Int. Cl.
B32B 3/30    (2006.01)
G02B 1/14    (2015.01)
(Continued)

(52) U.S. Cl.
CPC .................. *G02B 1/14* (2015.01); *B32B 3/30* (2013.01); *B32B 27/00* (2013.01); *B32B 27/281* (2013.01);
(Continued)

(58) Field of Classification Search
CPC ........... G02B 1/14; B32B 27/00; B32B 27/30; B32B 27/281; G06F 3/041
See application file for complete search history.

(56) References Cited

U.S. PATENT DOCUMENTS

| | | | |
|---|---|---|---|
| 2010/0208350 A1 | 8/2010 | Yoshihara | |
| 2011/0209901 A1 | 9/2011 | MacDonald et al. | |
| 2015/0049261 A1* | 2/2015 | Kobayashi | C08G 8/30 349/12 |

FOREIGN PATENT DOCUMENTS

| | | |
|---|---|---|
| CN | 101842423 | 9/2010 |
| CN | 103597013 | 2/2014 |

(Continued)

OTHER PUBLICATIONS

Ding, et al., Polyimide New Material, Science Press, 1998, 5 pages, ISBN 7-03-006688X.
(Continued)

*Primary Examiner* — Catherine A. Simone
(74) *Attorney, Agent, or Firm* — Hamre, Schumann, Mueller & Larson, P.C.

(57) ABSTRACT

The present invention provides a layered body for organic electroluminescence which is excellent in the hardness, the transparency and the folding-durable performance.
The present invention is a layered body for organic electroluminescence in which an optical layered body is laminated on one surface of an organic electroluminescence layer and which is not cracked or fractured when a test in which the entire area of the layered body for organic
(Continued)

electroluminescence is folded 180 degrees at 20 mm intervals is repeated 100,000 times.

13 Claims, 1 Drawing Sheet

(30) Foreign Application Priority Data

| Jul. 17, 2015 | (JP) | 2015-143494 |
|---|---|---|
| Jul. 17, 2015 | (JP) | 2015-143495 |
| Jul. 17, 2015 | (JP) | 2015-143496 |
| Jul. 17, 2015 | (JP) | 2015-143497 |

(51) Int. Cl.

| B32B 27/00 | (2006.01) |
|---|---|
| B32B 27/28 | (2006.01) |
| B32B 27/30 | (2006.01) |
| G06F 3/041 | (2006.01) |
| H01L 51/52 | (2006.01) |
| H01L 27/32 | (2006.01) |
| H01L 51/00 | (2006.01) |

(52) U.S. Cl.
CPC .............. *B32B 27/30* (2013.01); *G06F 3/041* (2013.01); *H01L 51/5253* (2013.01); *B32B 2305/72* (2013.01); *B32B 2307/40* (2013.01); *B32B 2307/536* (2013.01); *B32B 2309/105* (2013.01); *H01L 27/323* (2013.01); *H01L 51/0097* (2013.01); *H01L 2251/5338* (2013.01); *H01L 2251/562* (2013.01)

(56) References Cited

FOREIGN PATENT DOCUMENTS

| JP | 2006-193596 | 7/2006 | | |
|---|---|---|---|---|
| JP | 2007-204736 | 8/2007 | | |
| JP | 2013-168657 | 8/2013 | | |
| JP | 2014-151496 | 8/2014 | | |
| JP | 2014-186210 | 10/2014 | | |
| JP | 2014-205278 | 10/2014 | | |
| WO | 2012/129422 | 9/2012 | | |
| WO | WO-2013146482 A1 | * | 10/2013 | ............... C08G 8/30 |
| WO | 2014/163352 | 10/2014 | | |

OTHER PUBLICATIONS

Zhang, et al., "Preparation and Performance Study of 1, 3-bis (4-amino-2-trifluoromethyl-phenoxy) Benzene and its Transparent Polyimide Film", Insulating Materials, 43 (1), 2010, pp. 4-8 & p. 13—English Abstract on p. 4.

Han, et al., "The Preparation and Properties of Fluorinated Diamine and Its Polyimide Film", Journal of Southwest University of Science and Technology, vol. 27, No. 4, Dec. 2012, pp. 15-19—English Abstract on p. 15.

Lu, et al., "Synthesis and Properties of Soluble and Transparent Fluorine-Containing Polyimide Thin Films", Polymer Materials Science and Engineering, vol. 29, No. 2, Feb. 2013, pp. 13-16— English Abstract on p. 16.

* cited by examiner

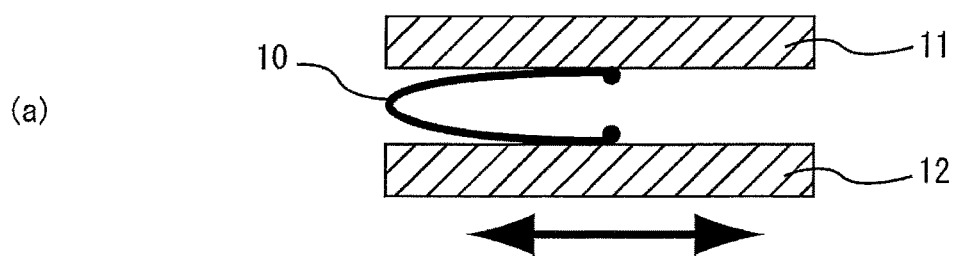
(a)
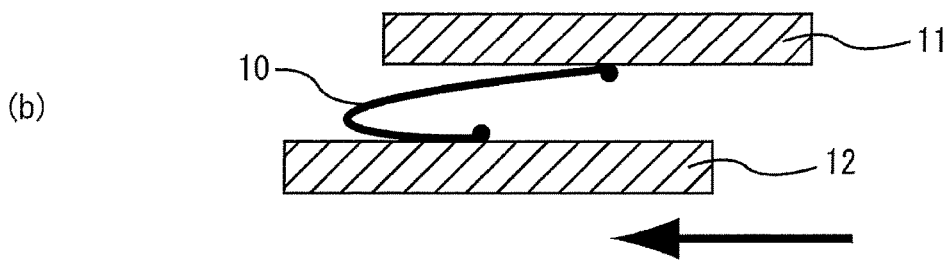
(b)
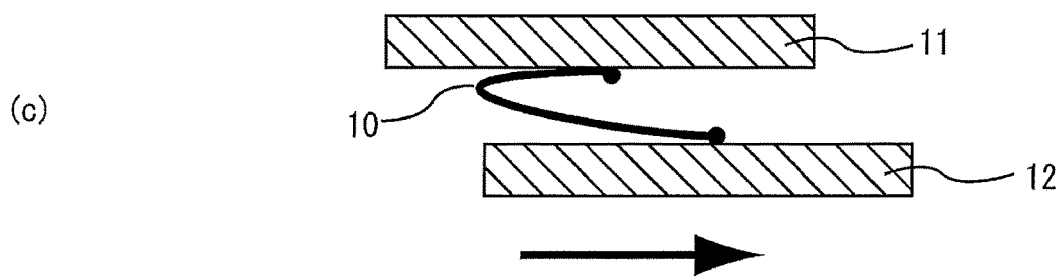
(c)

LAYERED BODY FOR OPTICAL MEMBER AND IMAGE DISPLAY DEVICE

TECHNICAL FIELD

The present invention relates to a layered body for an optical member and an image display device.

BACKGROUND ART

Optical films to be used for touch panels or organic electroluminescence, which have rapidly become widespread in recent years, have excellent hardness and sometimes are required to have such excellent folding-durable performance that cracks are not produced even by folding the optical films repeatedly.

However, since the hardness and the folding-durable performance usually have a trade-off relation, in conventional optical films, when the hardness is improved, the folding-durable performance is decreased, and when the folding-durable performance is improved, the hardness is decreased, and both cannot be simultaneously made to be excellent.

Further, in a display screen of a touch panel or organic electroluminescence, a glass substrate is often used. However, although glass has high hardness, it breaks when folded, and therefore folding properties cannot be imparted to the glass. In addition, glass is a material with a large specific gravity and its thickness needs to be decreased in order to reduce its weight. However, when its thickness is decreased, there is a problem that it is easily broken because of decrease in strength.

Further, for example, Patent Document 1 discloses an optical film provided with two hard coat layers different in Vickers hardness from each other on one surface of a substrate film of a cellulose acylate film or a polyester film as an optical film having hardness and bending properties.

However, although such an optical film has excellent hardness, sometimes a substrate film is broken or a trace of folding remains by folding the film repeatedly, and the film does not satisfy folding-durable performance required in recent years.

Further, it is investigated to use a polyimide film as a substrate film in optical films since the polyimide film has excellent mechanical strength, but in general, the polyimide film has a problem that it is low in transparency and is not suitable for applications as an optical film.

Moreover, it is difficult to pursue excellent folding-durable performance required in recent years and an excellent hardness required in recent years simultaneously even when the polyimide film is used as a substrate film.

CITATION LIST

Patent Literature

Patent Literature 1: JP 2014-186210 A

SUMMARY OF INVENTION

Technical Problem

In view of the above state of the art, it is an object of the present invention to provide a layered body for an optical member which is excellent in the hardness, the transparency and the folding-durable performance, and a foldable image display device.

Solution to Problem

A first present invention pertains to a layered body for an optical member which is used as a surface material of the optical member and has a substrate film and at least one cured resin layer, the layered body being not cracked or fractured when a test in which the entire area of the layered body for an optical member is folded 180 degrees at 20 mm intervals is repeated 100,000 times.

Further, a second present invention pertains to a layered body for an optical member which is used as a surface material of the optical member and has a substrate film and at least one cured resin layer, the substrate film including an eluting layer formed in the vicinity of an interface with the cured resin layer, the cured resin layer containing a material component, eluted from the eluting layer, constituting the substrate film, and the substrate film being a polyimide film or an aramid film.

The layered body for an optical member of the present invention is preferably not cracked or fractured when a test in which the entire area of the layered body for an optical member is folded 180 degrees at 3 mm intervals is repeated 100,000 times.

Further, in the layered body for an optical member of the present invention, the hardness of a pencil hardness test (load of 1 kg) of the cured resin layer, specified in JIS K5600-5-4 (1999), is preferably 4H or higher.

Further, the layered body for an optical member of the present invention is preferably not scuffed in a steel wool resistance test in which the surface of a cured resin layer is scrubbed to and fro 3500 times with #0000 steel wool under a load of 1 kg/cm$^2$.

Further, in the layered body for an optical member of the present invention, it is preferred that spectral reflectivities of the layered body for an optical member in a wavelength region of 400 nm to 700 nm are determined, and a standard deviation of the spectral reflectivity in an arbitrary range of 50 nm is less than 0.045.

Further, the substrate film is preferably a polyethylene terephthalate film, a polyimide film, a triacetyl cellulose film, a polyethylene naphthalate film, a polyamide-imide film, a polyetherimide film, a polyetherketone film, a polyamide film, or an aramid film.

A thickness of the substrate film is preferably 10 to 100 μm.

Further, the layered body for an optical member of the present invention preferably further has a cured layer of a monofunctional monomer, and preferably has the cured layer of a monofunctional monomer on a side of the cured resin layer of the substrate film.

Further, in the layered body for an optical member of the present invention, the cured resin layer preferably has a first hard coat layer disposed on a surface opposite to the optical member of the substrate film, and a second hard coat layer disposed on a surface opposite to a side of the substrate film of the first hard coat layer.

Further, it is preferred that the second hard coat layer contains a cured product of a polyfunctional (meth)acrylate monomer as a resin component, and the first hard coat layer contains a cured product of a polyfunctional (meth)acrylate as a resin component and silica fine particles dispersed in the resin component.

The silica fine particles are preferably reactive silica fine particles.

Further, in the layered body for an optical member of the present invention, the cured resin layer preferably has a projection and depression shape on a surface on a side opposite to the substrate film.

Further, a foldable image display device formed by using the layered body for an optical member of the present invention also constitutes the present invention.

Hereinafter, the present invention will be described in detail.

The layered body for an optical member of the first present invention (hereinafter, also referred to as a layered body of the first present invention), and the layered body for an optical member of the second present invention (hereinafter, also referred to as a layered body of the second present invention) are used as a surface material of an optical member and have a substrate film and at least one cured resin layer. In addition, in the following description, when the layered body of the first present invention is not particularly distinguished from the layered body of the second present invention, these layered bodies are collectively referred to as "a layered body of the present invention".

The optical member is not particularly limited, and examples thereof include liquid crystal displays, organic electroluminescence (organic EL), field emission displays, touch panels, and the like.

The substrate film is not particularly limited, and for example, a polyethylene terephthalate film, a polyimide film, a triacetyl cellulose film, a polyethylene naphthalate film, a polyamide-imide film, a polyetherimide film, a polyetherketone film, a polyamide film, or an aramid film is suitably used. As a substrate film made of these materials, a film which is not cracked in a folding-durable test described later and has excellent optical properties such as transparency is preferably used. Among these films, a polyimide film or an aramid film is preferred as a substrate film since these films have excellent hardness.

Herein, the polyimide film and the aramid film are commonly colored (in yellow) since they each have an aromatic ring in a molecule; however, it is preferred to use a film referred to as "transparent polyimide" or "transparent aramid" whose transparency is enhanced by modifying a skeleton in the molecules when the film is used for optical film applications. On the other hand, conventional colored polyimide films or the like are preferably used for electronic material applications such as printers and electronic circuits in terms of heat resistance and bending properties.

Herein, in the layered body of the present invention, the excellent hardness means that the hardness of the hard coat layer which is measured under the condition of the pencil hardness test (load of 1 kg) specified in JIS K5600-5-4 (1999), described later, is 4H or higher, and the hardness is preferably 6H or higher, more preferably 7H or higher.

In the layered body of the present invention, the excellent transparency means that a total light transmittance is 85% or more when a hard coat layer described later does not have a projection and depression shape on a surface on a side opposite to the substrate film, and the total light transmittance is preferably 90% or more.

On the other hand, the excellent transparency means that a total light transmittance is 80% or more when the hard coat layer described later has a projection and depression shape on a surface on a side opposite to the substrate film, and the total light transmittance is preferably 85% or more.

In the layered body of the second present invention, the substrate film includes an eluting layer formed in the vicinity of an interface with the cured resin layer.

The eluting layer is a layer formed by being modified by a composition (for example, a composition for a hard coat layer described later) applied onto the substrate film in forming the cured resin layer, and in the layered body of the second present invention, as described later, a material component of the substrate film, which is eluted from the eluting layer, is contained in the cured resin layer.

The eluting layer is formed in the vicinity of an interface with the cured resin layer, and specifically, the eluting layer is preferably formed within a range from the interface on a side of the cured resin layer to 300 nm in a thickness direction of the substrate film. In addition, the eluting layer can be identified by cross-section observation by a microscope in a thickness direction of the layered body of the second present invention, and the range where the eluting layer is formed is an average of thicknesses of arbitrary 10 locations which are observed in cross-section observation by a microscope.

In the layered body of the second present invention, the substrate film is a polyimide film or an aramid film.

Examples of a material of the polyimide film include compounds having a structure represented by the following formula.

In addition, in the following formula, n is a repeating unit and represents an integer of 2 or more.

[Formula 1]

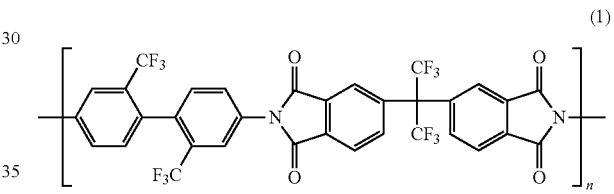

(1)

[Formula 2]

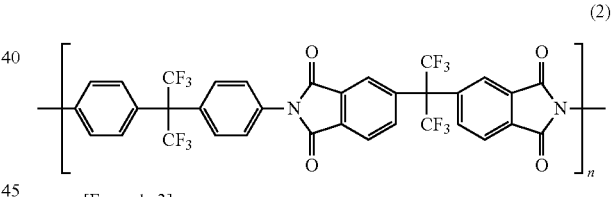

(2)

[Formula 3]

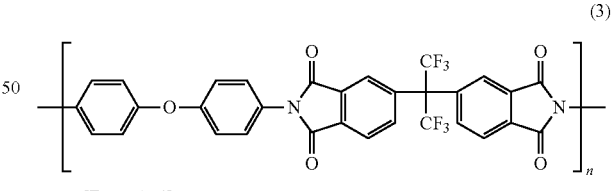

(3)

[Formula 4]

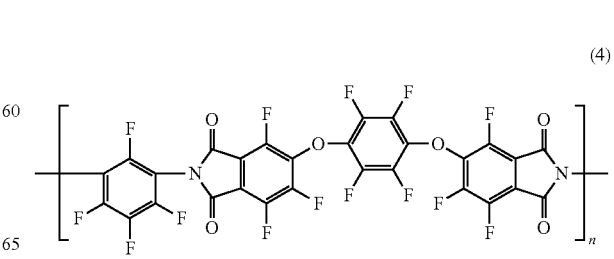

(4)

[Formula 5]
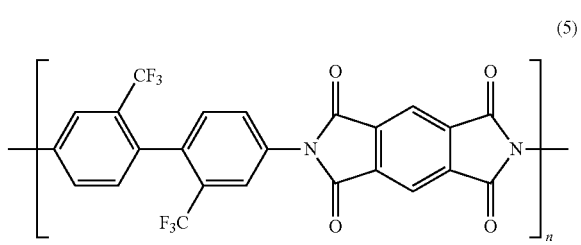
[Formula 6]
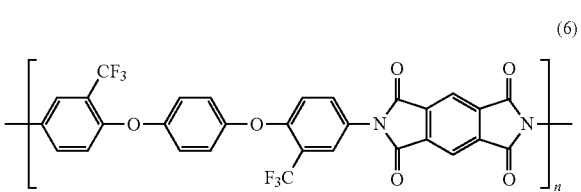
[Formula 7]
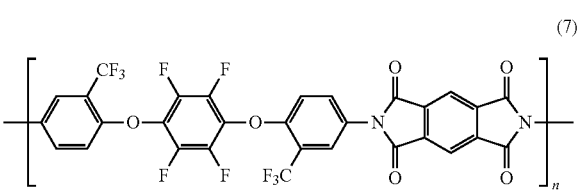
[Formula 8]
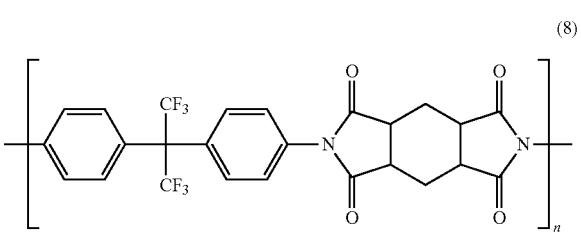
[Formula 9]
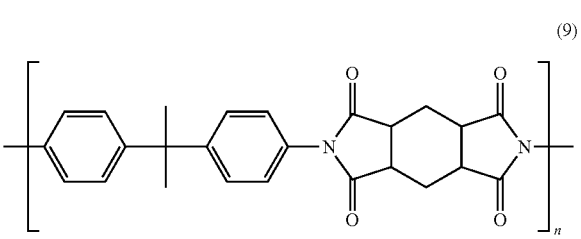
[Formula 10]
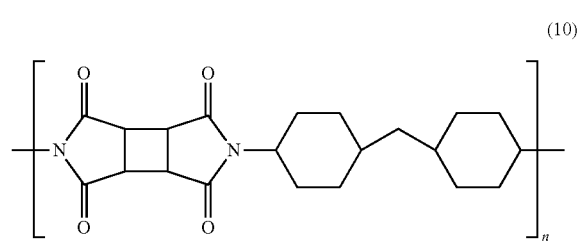
[Formula 11]
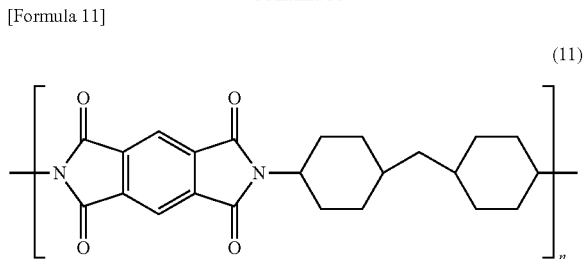
[Formula 12]
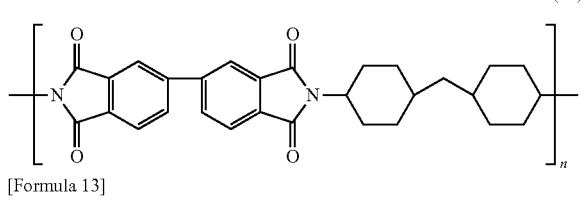
[Formula 13]
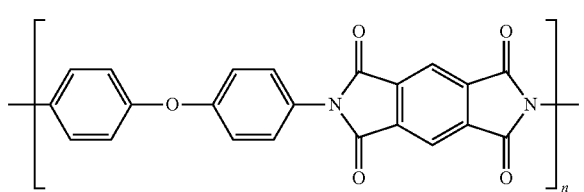
[Formula 14]
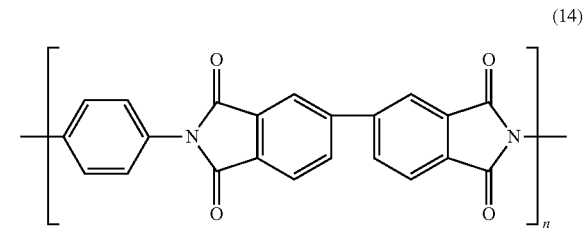
[Formula 15]
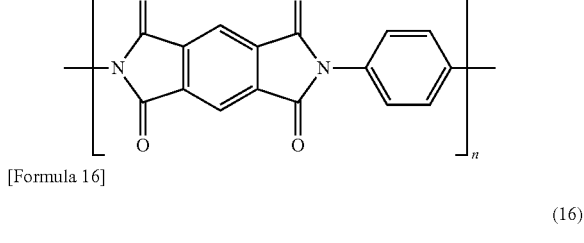
[Formula 16]
(16)
[Formula 17]
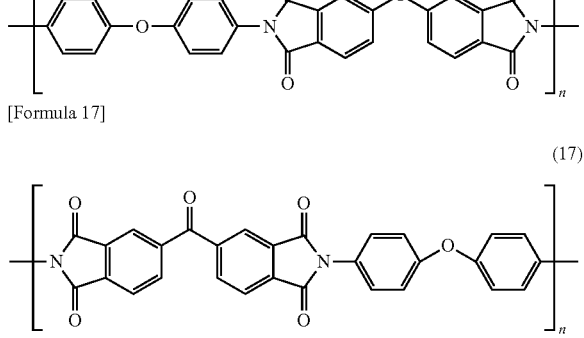

Further, the aramid film is one which generally has skeletons represented by the following formulas (18) and (19), and examples of the aramid film include compounds represented by the following formula (20).

In addition, in the following formula, n is a repeating unit and represents an integer of 2 or more.

[Formula 18]

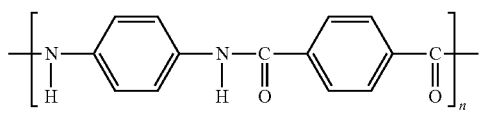

(18)

[Formula 19]

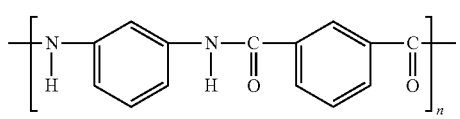

(19)

[Formula 20]

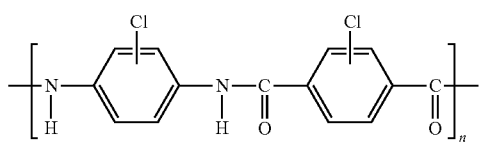

(20)

Commercially available products may be used for the polyimide film or the aramid film represented by the above formulas (1) to (17) and (20).

Examples of the commercially available products of the above transparent polyimide film include NEOPULIM manufactured by MITSUBISHI GAS CHEMICAL CO., INC. and the like, and examples of the commercially available products of the above transparent aramid film include MICTRON manufactured by Toray Industries, Inc. and the like.

The polyimide film or the aramid film represented by the formulas (1) to (17) and (20) may be one synthesized by a publicly known method.

For example, a method of synthesizing a polyimide film represented by the above formula (1) is described in JP 2009-132091 A, and specifically, the polyimide film can be obtained by a reaction represented by the following formula (21):

[Formula 21]

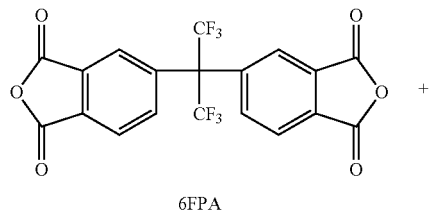

(21)

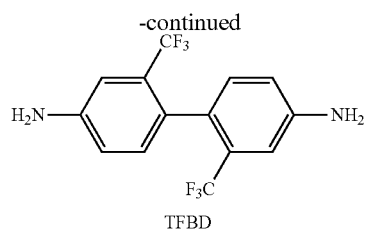

That is, the reaction between 4,4'-(hexafluoropropylidene)bis-phthalic dianhydride (6FPA) and 2,2'-bis(trifluoromethyl)-4,4'-diaminobiphenyl (TFDB).

A weight-average molecular weight of the polyimide film or the aramid film is preferably in a range of 3000 to 500,000, more preferably in a range of 5000 to 300,000, and even more preferably in a range of 10,000 to 200,000. When the weight-average molecular weight is less than 3000, sometimes adequate strength is not achieved, and when the weight-average molecular weight is more than 500,000, since the viscosity of a film material is increased and its solubility is decreased, sometimes a film having a smooth surface and a uniform thickness is not obtained.

In the present description, the weight-average molecular weight is a polystyrene equivalent value measured by gel permeation chromatography (GPC).

Among the above polyimide films or aramid films, polyimide films or aramid films having a structure in which intramolecular or intermolecular charge transfer hardly occurs are preferred from the viewpoint of excellent transparency, and specific examples thereof include fluorinated polyimide films represented by the formulas (1) to (8) or the like, polyimide films having an alicyclic structure represented by the formulas (9) to (12) or the like, and aramid films having a halogen group represented by the formula (20) or the like.

Further, the fluorinated polyimide film represented by the formulas (1) to (8) or the like has high heat resistance since it has a fluorinated structure, and the fluorinated polyimide film has excellent transparency since it is not colored by heat during polyimide film production.

It is preferred to use the fluorinated polyimide film represented by the formulas (1) to (8) or the like, or the aramid film having a halogen group represented by the formula (20) or the like as the substrate film since the hardness of the hard coat layer which is measured under the condition of the pencil hardness test (load of 1 kg) specified in JIS K5600-5-4 (1999), described later, can be made 5H or higher. Among these, it is more preferred to use a polyimide film represented by the formula (1) since it can impart such an extremely excellent hardness that the pencil hardness is 7H or higher.

The substrate film preferably has a thickness of 10 to 100 µm. When the thickness of the substrate film is less than 10 µm, the curl of the layered body of the present invention becomes large, and sometimes a pencil hardness described later cannot be made to be 4H or higher because of insufficient hardness, and moreover, when the layered body of the present invention is produced by a roll-to-roll process, there is a possibility of bringing on deterioration of appearance since a wrinkle is easily produced. On the other hand, when the thickness of the substrate film is more than 100 µm, the folding property of the layered body of the present invention is insufficient and sometimes the layered body cannot satisfy requirements of a folding-durable test described later, and the layered body of the present invention becomes heavy and it is not preferred in terms of weight reduction.

The layered body of the first present invention is not cracked or fractured when a test in which the entire area of the layered body is folded 180 degrees at 20 mm intervals is repeated 100,000 times.

In addition, the layered body of the first present invention is preferably not cracked or fractured when a test in which the entire area of the layered body is folded 180 degrees at 15 mm intervals is repeated 100,000 times, is more preferably not cracked or fractured when a test in which the entire area of the layered body is folded 180 degrees at 10 mm intervals is repeated 100,000 times, and is even more preferably not cracked or fractured when a test in which the entire area of the layered body is folded 180 degrees at 3 mm intervals is repeated 100,000 times.

FIG. 1 is a sectional view schematically showing a test in which the entire area of the layered body of the present invention is folded 180 degrees at predetermined intervals (hereinafter, also referred to as a folding-durable test). In the present invention, if the predetermined interval is, for example, 20 mm, this means that a distance between the layered bodies opposed to each other is 20 mm.

As shown in FIG. 1(a), in the folding-durable test, first, one side of the layered body 10 of the present invention, and another side opposed to the one side are fixed to an upper fixing portion 11 and a lower fixing portion 12 arranged in parallel with each other, respectively. In addition, the layered body of the present invention may have any shape, but the layered body 10 of the present invention in the folding-durable test is preferably rectangular.

Further, as shown in FIG. 1, the upper fixing portion 11 is fixed and the lower fixing portion 12 is movable to the right and the left parallel with the upper fixing portion 11.

Next, as shown in FIG. 1(b), the lower fixing portion 12 is moved leftward, and thereby a bending site of the layered body 10 of the present invention is moved to the vicinity of the other side fixed to the lower fixed portion 12, and further the lower fixed portion 12 is moved rightward, and thereby a bending site of the layered body 10 of the present invention is moved to the vicinity of the one side fixed to the upper fixed portion 11 as shown in FIG. 1(c).

As shown in FIGS. 1(a) to 1(c), the entire area of the layered body 10 of the present invention can be folded 180 degrees by moving the lower fixed portion 12.

The layered body of the first present invention is not cracked or fractured in a test piece when a folding-durable test, described above and shown in FIG. 1(a) to (c), of the layered body 10 is performed 100,000 times. When the layered body 10 of the first present invention is cracked or fractured within 100,000 times in the folding-durable test, the folding-durable performance of the layered body of the first present invention is insufficient. In addition, in the present invention, it is preferred that the layered body is not cracked or fractured when the folding-durable test of the layered body 10 of the present invention is performed 150,000 times.

Further, the layered body 10 of the present invention may be one which is not cracked or fractured when the folding-durable test is performed on one surface of the layered body; however, the layered body 10 of the present invention is preferably not cracked or fractured when the folding-durable test is performed on both surfaces of the layered body.

In addition, in the present invention, the above-mentioned layered body 10 of the present invention is not cracked or fractured even when the same folding-durable test is performed with the layered body 10 rotated 90 degrees.

The layered body of the present invention preferably has anti-interference fringe performance.

The reason for this is that since the layered body of the present invention has folding properties, it newly has a problem of interference fringe that the interference fringe is noticeable in a folded portion or the interference fringe moves by folding the layered body.

In the layered body of the present invention, it is preferred that spectral reflectivities of the layered body in a wavelength region of 400 nm to 700 nm are determined, and a standard deviation of the spectral reflectivity in an arbitrary range of 50 nm is less than 0.045.

The standard deviation of the spectral reflectivity can be determined by the following procedure.

First, using a spectrophotometer, reflectance in a wavelength range of 380 nm to 780 nm of the layered body of the present invention is measured by a reflection measuring method at 5 degrees. Specifically, a surface on the side of the layered body of the present invention having the hard coat layer provided is irradiated with light having an incident angle of 5 degrees, and reflected light in a specular direction which is reflected on the layered body of the present invention is received to measure reflectance in a wavelength range of 380 nm to 780 nm.

Then, measured data in the wavelength range of 400 nm to 700 nm is approximated by a second-order polynomial.

Finally, a standard deviation is calculated from a difference between the measured value and an approximate value by the second-order polynomial in an arbitrary range of 50 nm.

In addition, as the spectral reflectivity, a spectral reflectivity measured by a spectrophotometer (MPC3100, manufactured by SHIMADZU Corp.) was used.

In the layered body of the present invention, a standard deviation of the spectral reflectivity in an arbitrary range of 50 nm is preferably less than 0.045 in a visible light region of 400 nm to 700 nm.

The layered body of the present invention satisfying requirements of the standard deviation of the spectral reflectivity has extremely excellent anti-interference fringe performance, and the interference fringe is not generated at a folded portion and a moving interference fringe generated by folding the layered body is not observed.

In the layered body of the present invention, the standard deviation of the spectral reflectivity in an arbitrary range of 50 nm is more preferably less than 0.035, and further preferably less than 0.025 in a visible light region of 400 nm to 700 nm.

Further, in the layered body of the present invention, a standard deviation in a wavelength range of 50 nm which has the largest standard deviation in the wavelength range of 400 nm to 700 nm, is furthermore preferably less than 0.045, particularly preferably less than 0.035, and most preferably less than 0.025.

The layered body of the present invention preferably further has a cured layer of a monofunctional monomer.

The layered body preferably has the cured layer of a monofunctional monomer on a side of the cured resin layer of the substrate film.

Further, the layered body may have the cured layer of a monofunctional monomer between the substrate film and a cured resin layer described later, and when the cured resin layer has a first hard coat layer and a second hard coat layer described later, the layered body may have the cured layer of a monofunctional monomer between the first hard coat layer and the second hard coat layer; however, from the viewpoint of imparting extremely excellent anti-interference fringe performance, it is more preferred that the layered body has the cured layer between the substrate film and a cured resin layer described later.

The cured layer of a monofunctional monomer is a layer for imparting the above-mentioned anti-interference fringe performance.

In the layered body of the present invention, when the cured layer of a monofunctional monomer is formed, since the substrate film or the like is dissolved by a monofunctional monomer component in a composition for a cured layer of a monofunctional monomer described later, a refractive index of a dissolved portion of the substrate film varies gradually and an interface reflection can be suppressed, and therefore it is possible to impart extremely excellent anti-interference fringe performance.

A thickness of the cured layer of a monofunctional monomer is preferably 0.5 to 8 µm. When the thickness is less than 0.5 µm, sometimes the above-mentioned anti-interference fringe performance cannot be adequately imparted, and when the thickness is more than 8 µm, sometimes a sufficient pencil hardness cannot be imparted.

The thickness of the cured layer of a monofunctional monomer is more preferably 1 to 5 µm, and even more preferably 1 to 3 µm.

In addition, the thickness of the cured layer of a monofunctional monomer can be measured by cross-section observation by a microscope.

Examples of the monofunctional monomer to be used for the cured layer of a monofunctional monomer include an ionizing radiation-curing resin, and particularly, a monofunctional acryl monomer is suitably used.

The monofunctional acryl monomer is preferably at least one selected from the group consisting of acryloyl morpholine, N-acryloyloxyethyl hexahydrophthalimide, cyclohexylacrylate, tetrahydrofurylacrylate, isobornyl acrylate, phenoxyethyl acrylate, and adamantyl acrylate, and is particularly preferably acryloyl morpholine since acryloyl morpholine is capable of suitably dissolving a polyimide film having excellent solvent resistance even when the polyimide film is used as a resin base material, and can be imparted with extremely excellent anti-interference fringe performance.

The cured layer of a monofunctional monomer can be formed, for example, by applying a composition for a cured layer of a monofunctional monomer containing the above-mentioned monofunctional monomer and a solvent onto a surface of the substrate film, and drying and then curing the resulting applied film.

As the solvent in the composition for the cured layer of a monofunctional monomer, a solvent used in a composition for a hard coat layer, described later, can be suitably used.

To the composition for a cured layer of a monofunctional monomer, photo-polymerization initiators, dispersants, surfactants, antistatic agents, silane coupling agents, thickeners, coloring inhibitors, coloring agents (pigment, dye), antifoaming agents, leveling agents, flame retarders, ultraviolet ray absorbers, adhesion promoters, polymerization inhibitors, antioxidants, surface modifiers and the like may be added, as with a composition for a hard coat layer described later.

The layered body of the present invention has at least one cured resin layer.

The layered body of the present invention can be obtained by selection of a material of the resin base material having bending resistance and control of a thickness of the resin base material having bending resistance, and control of strength of the cured resin layer and a method of lamination on the resin base material having bending resistance in accordance with the strength of the cured resin layer.

In the layered body of the present invention, the cured resin layer preferably has a first hard coat layer disposed on a surface opposite to the optical member of the substrate film, and a second hard coat layer disposed on a surface opposite to a side of the substrate film of the first hard coat layer.

Hereinafter, when it is not necessary to distinguish between the first hard coat layer and the second hard coat layer, each of these layers is referred to as merely "a hard coat layer".

The first hard coat layer is a layer for imparting the hardness, and the Martens hardness at a center of its cross-section is preferably 500 MPa or more and less than 1000 MPa.

When the Martens hardness of the first hard coat layer is set to the above-mentioned range, it is possible to increase the hardness of a pencil hardness test (load of 1 kg), specified in JIS K5600-5-4 (1999), of the hard coat layer to 4H or higher and impart adequate folding-durable performance to the layered body of the present invention. A more preferred lower limit of the Martens hardness at a center of a cross-section of the first hard coat layer is 600 MPa and a more preferred upper limit is 950 MPa.

Further, the second hard coat layer is a layer for imparting the above-mentioned folding-durable performance and abrasion-resistance, and the Martens hardness at a center of its cross-section is preferably 350 MPa or more and 600 MPa or less. When the Martens hardness of the second hard coat layer is set to the above-mentioned range, the second hard coat layer has sufficient folding-durable performance, and it is possible to impart such extremely excellent abrasion-resistance that a scuff is not produced in a steel wool resistance test in which the surface of the above hard coat layer is scrubbed to and fro 3500 times with #0000 steel wool under a load of 1 kg/cm$^2$. A more preferred lower limit of the Martens hardness at a center of a cross-section of the second hard coat layer is 375 MPa and a more preferred upper limit is 575 MPa.

In the layered body of the present invention, the Martens hardness of the first hard coat layer is preferably larger than the Martens hardness of the second hard coat layer. By having such a relation of the Martens hardness, the pencil hardness of the layered body of the present invention particularly becomes better. The reason for this is that when the layered body of the present invention is subjected to the pencil hardness test and is pressed down with a pencil loaded, deformation of the layered body of the present invention is suppressed resulting in less scuff or depression deformation. Further, the layered body of the present invention has sufficient folding-durable performance and can be imparted with such extremely excellent abrasion-resistance that a scuff is not produced in a steel wool resistance test in which the surface of the above hard coat layer is scrubbed to and fro 3500 times with #0000 steel wool under a load of 1 kg/cm$^2$.

Examples of a method of making the Martens hardness of the first hard coat layer larger than the Martens hardness of the second hard coat layer include a method of controlling the content of silica fine particle described later to be higher on a first hard coat layer side.

In the layered body of the present invention, the hard coat layer may have a single structure, and in this case, it is preferred that silica fine particles described later are adapted to be localized on a side of the substrate film in the hard coat layer, that is, that an abundance ratio of silica fine particles in the hard coat layer is inclined so as to be higher on the substrate film side and to decrease toward the side opposite to the substrate film side.

In addition, in the present specification, "Martens hardness" is hardness at the time of pressing down an indenter by 500 nm in the hardness measurement according to a nanoindentation method.

In addition, in the present specification, the Martens hardness measurement according to a nanoindentation method was conducted using "TI950 TriboIndenter" manufactured by HYSITRON, Inc. That is, a Berkovich indenter as the above-mentioned indenter (triangular pyramid) is used, and the indenter is pressed down by 500 nm from the surface of the hard coat layer of the layered body of the present invention and held constant as-is to relax residual stress. Thereafter, the indenter is unloaded and a maximum load after relaxation is measured, and the Martens hardness is calculated from $P_{max}/A$ using the maximum load $P_{max}$ (µN) and an indent area A (nm$^2$) having a depth of 500 nm.

The first hard coat layer preferably contains a cured product of a polyfunctional (meth)acrylate monomer as a resin component, and contains silica fine particles dispersed in the resin component.

Examples of the polyfunctional (meth)acrylate monomer include trimethylolpropane tri(meth)acrylate, tripropylene glycol di(meth)acrylate, diethylene glycol di(meth)acrylate, dipropylene glycol di(meth)acrylate, pentaerythritol tri(meth)acrylate, pentaerythritol tetra(meth)acrylate, dipentaerythritol hexa(meth)acrylate, 1,6-hexanediol di(meth)acrylate, neopentyl glycol di(meth)acrylate, trimethylolpropane tri(meth)acrylate, ditrimethylolpropane tetra(meth)acrylate, dipentaerythritol penta(meth)acrylate, tripentaerythritol octa(meth)acrylate, tetrapentaerythritol deca(meth)acrylate, isocyanuric acid tri(meth)acrylate, isocyanuric acid di(meth)acrylate, polyester tri(meth)acrylate, polyester di(meth)acrylate, bisphenol di(meth)acrylate, diglycerine tetra(meth)acrylate, adamantyl di(meth)acrylate, isobornyl di(meth)acrylate, dicyclopentane di(meth)acrylate, tricyclodecane di(meth)acrylate and ditrimethylolpropane tetra(meth)acrylate, and PO-, EO- or caprolactone-modified products thereof.

Among these polyfunctional (meth)acrylate monomers, trifunctional (meth)acrylate monomers to hexafunctional (meth)acrylate monomers are preferred since these monomers can suitably satisfy the above-mentioned Martens hardness, and for example, pentaerythritol triacrylate (PETA), dipentaerythritol hexaacrylate (DPHA), pentaerythritol tetraacrylate (PETTA), dipentaerythritol pentaacrylate (DPPA), trimethylolpropane tri(meth)acrylate, tripentaerythritol octa(meth)acrylate, tetrapentaerythritol deca(meth)acrylate and the like are preferred.

In addition, in the present specification, "(meth)acrylate" means "acrylate" and "methacrylate".

The silica fine particles are preferably reactive silica fine particles. The reactive silica fine particles are silica fine particles capable of forming a crosslinking structure with the polyfunctional (meth)acrylate monomer, and by containing the reactive silica fine particles, the hardness of the first hard coat layer can be adequately enhanced.

The reactive silica fine particles preferably have a reactive functional group on their surfaces, and as the reactive functional group, for example, a polymerizable unsaturated group is suitably used, more preferably a photocurable unsaturated group is used, and particularly preferably an ionizing radiation-curable unsaturated group is used. Specific examples of the reactive functional group include an ethylenic unsaturated bond such as (meth)acryloyl group, a vinyl group and an allyl group, an epoxy group and the like.

The reactive silica fine particle is not particularly limited, publicly known one can be used as the reactive silica fine particle, and examples thereof include the reactive silica fine particle described in JP 2008-165040 A and the like.

Examples of commercially available products of the reactive silica fine particle include products such as MIBK-SD, MIBK-SDMS, MIBK-SDL and MIBK-SDZL manufactured by NISSAN CHEMICAL INDUSTRIES, LTD., products such as V8802 and V8803 manufactured by JGC Catalysts and Chemicals Ltd., and the like.

Further, the silica fine particles may be spherical silica fine particles; however, they are preferably deformed shape silica fine particles. Spherical silica fine particles and deformed shape silica fine particle may also be mixed.

In addition, in the present specification, the deformed shape silica fine particle means a silica fine particle having a potato-like shape with random concavity and convexity on its surface.

Since the deformed shape silica fine particle has a larger surface area than that of a spherical silica fine particle, a contact area of the deformed shape silica fine particle with the above-mentioned polyfunctional (meth)acrylate is increased by containing such a deformed shape silica fine particle, and therefore the hardness (pencil hardness) of the hard coat layer can be made to be more excellent.

Whether the silica fine particle is the deformed shape silica fine particle or not can be found through the cross-section observation of the first hard coat layer by an electron microscope.

When the silica fine particle is a deformed shape silica fine particle, an average particle diameter of the deformed shape silica fine particle is preferably 5 to 200 nm. When the average particle diameter of the deformed shape silica fine particles is less than 5 nm, the fine particles are difficult to produce, sometimes the fine particles may be aggregated with one another, it may be extremely difficult to deform the fine particles, and moreover, the deformed shape silica fine particles may be aggregated at a stage of an ink before application because of poor dispersibility. On the other hand, when the average particle diameter of the deformed shape silica fine particle is more than 200 nm, large projections and depressions may be formed on the hard coat layer, or defects such as an increase of haze may be caused.

In addition, an average particle diameter of the deformed shape silica fine particles is an average of a maximum value (longest diameter) and a minimum value (shortest diameter) of the distance between two points on an outer periphery of the deformed shape silica fine particle appearing through the observation of a cross-section of the hard coat layer by a microscope.

The hardness (Martens hardness) of the first hard coat layer can be controlled by controlling a size and a compounded amount of the silica fine particle, and consequently the first hard coat layer and the second hard coat layer can be formed.

For example, when the first hard coat layer is formed, a diameter of the silica fine particle is preferably 5 to 200 nm, and an amount of the silica fine particles is preferably 25 to 60 parts by mass with respect to 100 parts by mass of the resin component.

Further, the second hard coat layer preferably contains a cured product of a polyfunctional (meth)acrylate as a resin component.

Examples of the polyfunctional (meth)acrylate include the same ones as those described above.

Further, the second hard coat layer may contain polyfunctional urethane (meth)acrylate and/or polyfunctional epoxy (meth)acrylate in addition to the polyfunctional (meth)acrylate as a resin component.

Moreover, the second hard coat layer may contain the above silica fine particles. The content of the silica fine particles in the second hard coat layer is not particularly limited, and the content is preferably, for example, 0 to 20 wt % in the second hard coat layer.

The hard coat layer may contain materials other than the material described above within a scope of satisfying the above-mentioned Martens hardness in any of the case of the first hard coat layer and the case of the second hard coat layer, and the hard coat layer may contain, for example, a polymerizable monomer or a polymerizable oligomer as a material of a resin component which forms a cured product by irradiation of ionizing radiation.

Examples of the polymerizable monomer or the polymerizable oligomer include (meth)acrylate monomers having a radically polymerizable unsaturated group in a molecule or (meth)acrylate oligomers having a radically polymerizable unsaturated group in a molecule.

Examples of the (meth)acrylate monomers having a radically polymerizable unsaturated group in a molecule or the (meth)acrylate oligomers having a radically polymerizable unsaturated group in a molecule, include monomers or oligomers such as urethane (meth)acrylate, polyester (meth)acrylate, epoxy (meth)acrylate, melamine (meth)acrylate, polyfluoroalkyl (meth)acrylate and silicone (meth)acrylate. These polymerizable monomers or polymerizable oligomers may be used singly or may be used in combination of two or more thereof. Among these monomers or oligomers, urethane (meth)acrylate which is polyfunctional (hexafunctional or higher) and has a weight-average molecular weight of 1000 to 10,000 is preferred.

In addition, in order to adjust the hardness or the viscosity of a composition or to improve the adhesiveness, a monofunctional (meth)acrylate monomer may be further contained as a material constituting the hard coat layer.

Examples of the monofunctional (meth)acrylate monomer include hydroxyethyl acrylate (HEA), glycidyl methacrylate, methoxy polyethylene glycol (meth)acrylate, isostearyl (meth)acrylate, 2-acryloyloxyethyl succinate, acryloyl morpholine, N-acryloyloxyethyl hexahydrophthalimide, cyclohexyl acrylate, tetrahydrofuryl acrylate, isobornyl acrylate, phenoxyethyl acrylate, and adamantyl acrylate.

The weight-average molecular weight of the polymerizable monomer is preferably less than 1000, and more preferably 200 to 800 from the viewpoint of improving the hardness of the hard coat layer.

Further, the weight-average molecular weight of the polymerizable oligomer is preferably 1000 to 20,000, more preferably 1000 to 10,000, and even more preferably 2000 to 7000.

In addition, in the present specification, the weight-average molecular weights of the polymerizable monomer and the polymerizable oligomer are each a weight-average molecular weight on the polystyrene equivalent basis measured by a GPC method.

The hard coat layer may contain an ultraviolet ray absorber (UVA).

While as described later, the layered body of the present invention is particularly suitably used for a mobile terminal such as a foldable smartphone or a tablet terminal, such a mobile terminal is often used outdoors, and therefore there is a problem that a polarizer disposed at a lower portion of the layered body of the present invention is exposed to ultraviolet rays and is easily degraded.

However, since the hard coat layer is arranged on a display screen side of the polarizer, the degradation due to exposure of the polarizer to ultraviolet rays can be favorably prevented when an ultraviolet ray absorber is contained in the hard coat layer.

In addition, the ultraviolet ray absorber (UVA) may be contained in the substrate film in the layered body. In this case, the ultraviolet ray absorber (UVA) does not have to be contained in the hard coat layer.

Examples of the ultraviolet absorber include triazine ultraviolet ray absorbers, benzophenone ultraviolet ray absorbers, and benzotriazole ultraviolet ray absorbers.

Examples of the triazine ultraviolet ray absorbers include 2-(2-hydroxy-4-[1-octyloxycarbonylethoxy]phenyl)-4,6-bis(4-phenylphenyl)-1,3,5-triazine, 2-[4-[(2-hydroxy-3-dodecyloxypropyl)oxy]-2-hydroxyphenyl]-4,6-bis(2,4-dimethylphenyl)-1,3,5-triazine, 2,4-bis[2-hydroxy-4-butoxyphenyl]-6-(2,4-dibutoxyphenyl)-1,3,5-triazine, 2-[4-[(2-hydroxy-3-tridecyloxypropyl)oxy]-2-hydroxyphenyl]-4,6-bis(2,4-dimethylphenyl)-1,3,5-triazine, and 2-[4-[(2-hydroxy-3-(2'-ethyl)hexyl)oxy]-2-hydroxyphenyl]-4,6-bis(2,4-dimethylphenyl)-1,3,5-triazine.

Further, examples of commercially available triazine ultraviolet ray absorbers include TINUVIN 460 and TINUVIN 477 (both manufactured by BASF Ltd.), LA-46 (manufactured by ADEKA CORPORATION), and the like.

Examples of the benzophenone ultraviolet ray absorbers include 2-hydroxybenzophenone, 2,4-dihydroxybenzophenone, 2,2'-dihydroxy-4,4'-dimethoxybenzophenone, 2,2',4,4'-tetrahydroxybenzophenone, 2-hydroxy-4-methoxybenzophenone, 2-hydroxy-4-methoxybenzophenone-5-sulfonic acid and trihydrate thereof, 2-hydroxy-4-methoxybenzophenone-5-sodium sulfonate, and the like.

Further, examples of commercially available benzophenone ultraviolet ray absorbers include CHIMASSORB81/FL (manufactured by BASF Ltd.).

Examples of the benzotriazole ultraviolet ray absorbers include 2-ethylhexyl-3-[3-tert-butyl-4-hydroxy-5-(5-chloro-2H-benzotriazol-2-yl)phenyl]propionate, 2-(2H-benzotriazol-2-yl)-6-(normal chain or side chain dodecyl)-4-methylphenol, 2-[5-chloro(2H)-benzotriazol-2-yl]-4-methyl-6-(tert-butyl)phenol, 2-(2H-benzotriazol-2-yl)-4,6-di-tert-pentylphenol, 2-(2'-hydroxy-5'-methylphenyl)benzotriazole, 2-(2'-hydroxy-3',5'-di-tert-butylphenyl)benzotriazole, 2-(2'-hydroxy-3'-tert-butyl-5'-methylphenyl)benzotriazole, 2-(2'-hydroxy-3',5'-di-tert-butylphenyl)-5-chlorobenzotriazole, 2-(2'-hydroxy-3'-(3",4",5",6"-tetrahydrophthalimidemethyl)-5'-methylphenyl)benzotriazole, 2,2-methylenebis(4-(1,1,3,3-tetramethylbutyl)-6-(2H-benzotriazol-2-yl)phenol), 2-(2'-hydroxy-3'-tert-butyl-5'-methylphenyl)-5-chlorobenzotriazole and the like.

Further, examples of commercially available benzotriazole ultraviolet ray absorbers include KEMISORB 71D and KEMISORB 79 (both manufactured by Chemipro Kasei Kaisha, Ltd.), JF-80 and JAST-500 (both manufactured by Johoku Chemical Co., Ltd.), ULS-1933D (manufactured by Ipposha Oil Industries Co., Ltd.), RUVA-93 (manufactured by Otsuka Chemical Co., Ltd.), and the like.

Among the above-mentioned ultraviolet ray absorbers, triazine ultraviolet ray absorbers and benzotriazole ultraviolet ray absorbers are suitably used.

As the ultraviolet ray absorbers, a ultraviolet ray absorber having higher solubility in the resin component constituting the hard coat layer is preferred, and a ultraviolet ray absorber having less bleed out after the folding-durable test described above is preferred.

The ultraviolet ray absorber is preferably polymerized or oligomerized.

As the ultraviolet ray absorber, a polymer or oligomer which has a benzotriazole skeleton, a triazine skeleton or a benzophenone skeleton is preferred, and specifically, one formed by thermally copolymerizing (meth)acrylate having a benzotriazole skeleton or a benzophenone skeleton with methylmethacrylate (MMA) in an arbitrary ratio is preferred.

In addition, when the layered body of the present invention is applied to an organic light-emitting diode (OLED) or an organic EL layer, the ultraviolet ray absorber can play a role in protecting the OLED and the organic EL layer from ultraviolet rays.

The content of the ultraviolet ray absorber is not particularly limited; however, the content is preferably 1 to 6 parts by mass with respect to 100 parts by mass of the resin solid content of the hard coat layer. When the content of the ultraviolet ray absorber is less than 1 parts by mass, sometimes the effect of including the above-mentioned ultraviolet ray absorber in the hard coat layer cannot be adequately achieved, and when the content is more than 6 parts by mass, sometimes the hard coat layer is significantly colored or strength of the hard coat layer is reduced. A more preferred lower limit of the content of the ultraviolet ray absorber is 2 parts by mass and a more preferred upper limit is 5 parts by mass.

A layer thickness of the hard coat layer is preferably 2.0 to 5.0 µm for the case where the hard coat layer is the first hard coat layer and 0.5 to 4.0 µm for the case where the hard coat layer is the second hard coat layer. When the layer thickness is smaller than a lower limit, the hardness of the hard coat layer may be significantly decreased, and when the layer thickness is larger than an upper limit, coating of a coating solution for forming the hard coat layer may be difficult, and processing properties (particularly, chipping resistance) may be deteriorated, resulting from too large a thickness.

A more preferred lower limit of the thickness of the first hard coat layer is 2.5 µm, a more preferred upper limit is 4.5 µm, and a more preferred lower limit of the thickness of the second hard coat layer is 1.0 µm, and a more preferred upper limit is 3.5 µm.

In addition, the thickness of the hard coat layer is an average of thicknesses of arbitrary 10 locations which are obtained by measuring a cross-section of the hard coat layer through the observation with an electron microscope (SEM, TEM, STEM).

In the layered body of the present invention having the hard coat layer, a transmittance of light with a wavelength of 380 nm is preferably 10% or less, and more preferably 8% or less. When the transmittance is more than 10%, there is a possibility that a polarizer is exposed to ultraviolet rays and is degraded when the layered body of the present invention is used in a mobile terminal. A more preferred upper limit of the transmittance of light with a wavelength of 380 nm of the hard coat layer is 5%.

Further, the hard coat layer preferably has a haze of 2.5% or less. When the haze is more than 2.5%, there is a possibility that whitening of a display screen becomes a problem when the layered body of the present invention is used in a mobile terminal. A more preferred upper limit of the haze is 1.5%, and an even more preferred upper limit of the haze is 1.0%.

Further, the light transmittance and the haze can be measured according to JIS K 7361 using a haze meter (manufactured by MURAKAMI COLOR RESEARCH LABORATORY CO., Ltd., product number; HM-150).

In addition, the haze of the entire layered body of the present invention is a sum of the haze of the hard coat layer and the haze of the substrate film, and when the haze of the substrate film is higher than 1%, the haze of the entire layered body of the present invention becomes higher than 1%.

The hard coat layer may contain other components such as lubricants, plasticizers, fillers, antistatic agents, antiblocking agents, crosslinking agents, light stabilizers, antioxidants, coloring agents (dye, pigment) and the like, as required.

Further, in the layered body of the present invention, another hard coat layer (hereinafter, also referred to as a backside hard coat layer) may be formed on a surface opposite to the surface of the substrate film having the above-mentioned hard coat layer (the first hard coat layer and the second hard coat layer) provided thereon. Examples of the backside hard coat layer include a layer similar to the above-mentioned hard coat layer.

Further, the backside hard coat layer preferably has a backside hard coat layer (1) and/or a backside hard coat layer (2).

Examples of the backside hard coat layer (1) and the backside hard coat layer (2) include a layer having the same composition and thickness as those of the first hard coat layer or the second hard coat layer described above, respectively.

That is, when the layered body of the present invention has the backside hard coat layer, examples of a configuration of the backside hard coat layer include a configuration having the backside hard coat layer (1) similar to the above first hard coat layer, a configuration having the backside hard coat layer (1) similar to the above second hard coat layer, a configuration of lamination of the backside hard coat layer (1) similar to the above first hard coat layer and the backside hard coat layer (2) similar to the above second hard coat layer in this order from the substrate film side, and a configuration of lamination of the backside hard coat layer (1) similar to the above second hard coat layer and the backside hard coat layer (2) similar to the above first hard coat layer in this order from the substrate film side.

In addition, the backside hard coat layer does not require antifouling properties described later since it is arranged on a surface on a side opposite to the outermost surface.

Further, the layered body of the present invention preferably has antifouling properties. Such antifouling properties can be attained, for example, by containing an antifouling agent in the hard coat layer.

The hard coat layer containing the above-mentioned antifouling agent preferably has a contact angle of water on a surface of 100 degrees or more, and in the layered body of the present invention immediately after production, the contact angle of water on a surface of the hard coat layer is more preferably 105 degrees or more. The contact angle of water on a surface of the hard coat layer is preferably 90 degrees or more, and more preferably 103 degrees or more, after undergoing the steel wool resistance test in which the surface of the above second hard coat layer is scrubbed to and fro 3500 times with #0000 steel wool under a load of 1 $kg/cm^2$.

The antifouling agent is preferably contained in a state of being localized on the outermost surface side of the hard coat layer. When the antifouling agent is uniformly contained in the hard coat layer, an amount of the antifouling agent to be added needs to be increased in order to impart sufficient antifouling property, and there is a possibility of leading to a reduction in film strength of the hard coat layer. In addition, when the hard coat layer has the above-mentioned first hard coat layer and second hard coat layer, the antifouling agent is preferably contained in a state of being localized on the outermost surface side of the second hard coat layer arranged on the outermost surface.

Examples of a method of localizing the antifouling agent on the outermost surface side of the hard coat layer include a method in which an applied film formed with use of a composition for a hard coat layer described later is dried in forming the hard coat layer, and before curing the applied film, heat is added the applied film to reduce viscosity of a resin component contained in the applied film, and thereby flowability of the resin component is increased to localize the antifouling agent on the outermost surface side, and a method in which an antifouling agent with low surface tension is selected and used, the antifouling agent is floated on the surface of the applied film without adding heat during drying the applied film, and thereafter the applied film is cured to localize the antifouling agent on the outermost surface side.

The antifouling agent is not particularly limited, and examples thereof include silicone-containing antifouling agents, fluorine-containing antifouling agents, and silicone-containing and fluorine-containing antifouling agents, and these antifouling agents may be used singly or may be used in combination of two or more thereof. Further, the antifouling agent may be an acrylic antifouling agent.

The content of the antifouling agent is preferably 0.01 to 3.0 parts by mass with respect to 100 parts by mass of the above-mentioned resin material. When the content of the antifouling agent is less than 0.01 part by mass, sometimes it is impossible to impart adequate antifouling properties to a hard coat layer, and sometimes a scuff is produced in a steel wool resistance test because of a poor sliding property. On the other hand, when the content is more than 3.0 parts by mass, the hardness of the hard coat layer may be decreased, and the antifouling agent itself may become a ball (micelle state), causing fine phase separation (sea-island state) of the resin component and the antifouling agent of the hard coat layer, and making the hard coat layer cloudy.

The antifouling agent preferably has a weight-average molecular weight of 20,000 or less, and is a compound having preferably one or more reactive functional groups, and more preferably two or more reactive functional groups, in order to improve durability of antifouling property. Particularly, by using an antifouling agent having two or more reactive functional groups, it is possible to impart excellent abrasion-resistance.

In addition, when the antifouling agent does not have the reactive functional group, the antifouling agent is transferred to the backside in overlaying the layered body of the present invention in any form of a roll or a sheet. Therefore, when trying to bond or apply another member to the backside, peeling of another member may occur, and further another member may, easily peel off by performing a folding test plural times.

In addition, the weight-average molecular weight can be determined based on a polystyrene equivalent value measured by gel permeation chromatography (GPC).

Moreover, the antifouling agents having reactive functional groups are higher in performance-persistence (durability) of antifouling properties, and particularly, to the above-mentioned hard coat layer containing a fluorine-containing antifouling agent, fingerprints hardly adhere (fingerprints are inconspicuous), and a fingerprint removing property is also high. Moreover, since the hard coat layer containing a fluorine-containing antifouling agent can reduce surface tension at the time of applying the composition for forming a hard coat layer, it has an excellent leveling property, resulting in better appearance of the hard coat layer to be formed.

Further, a hard coat layer containing the silicone-containing antifouling agent is excellent in a sliding property and has high steel wool resistance.

The layered body of the present invention including such a silicone-containing antifouling agent in the hard coat layer has good slip when touching the layered body with a finger or a pen, and therefore it has good touch. Further, fingerprints hardly adhere to the hard coat layer (fingerprints are inconspicuous), and a fingerprint removing property is also high. Moreover, since surface tension at the time of applying the composition (composition for a hard coat layer) in forming a hard coat layer can be reduced, a leveling property is excellent, resulting in better appearance of the hard coat layer to be formed.

Further, the antifouling agents having reactive functional groups are procurable as commercially available products, and examples of the commercially available products excluding the above-mentioned antifouling agents include, as the silicone-containing antifouling agent, SUA1900L10 (manufactured by Shin Nakamura Chemical Co., Ltd.), SUA1900L6 (manufactured by Shin Nakamura Chemical Co., Ltd.), Ebecryl 1360 (manufactured by DAICEL-CYTEC CO., LTD.), UT3971 (manufactured by Nippon Synthetic Chemical Industry Co., Ltd.), BYK-UV 3500 (manufactured by BYK Japan KK), BYK-UV 3510 (manufactured by BYK Japan KK), BYK-UV 3570 (manufactured by BYK Japan KK), X22-164E, X22-174BX, X22-2426, KBM503, KBM5103 (manufactured by Shin-Etsu Chemical Co., Ltd.), TEGO-RAD2250, TEGO-RAD2300, TEGO-RAD2200N, TEGO-RAD2010, TEGO-RAD2500, TEGO-RAD2600, TEGO-RAD2700 (manufactured by Evonik Japan Co., Ltd.), Megaface RS854 (manufactured by DIC CORPORATION), and the like.

Examples of the fluorine-containing antifouling agent include Optool DAC, Optool DSX (manufactured by DAIKIN INDUSTRIES, LTD.), Megaface RS71, Megaface RS74 (manufactured by DIC CORPORATION), LINC 152EPA, LINC 151EPA, LINC 182UA (manufactured by Kyoeisha Chemical Co., Ltd.), Ftergent 650A, Ftergent 601AD, Ftergent 602, and the like.

Further, examples of the fluorine-containing and silicone-containing antifouling agent having a reactive functional group include Megaface RS851, Megaface RS852, Megaface RS853, Megaface RS854 (manufactured by DIC CORPORATION), OPSTAR TU2225, OPSTAR TU2224 (manufactured by JSR Corporation), X71-1203M (manufactured by Shin-Etsu Chemical Co., Ltd.), and the like.

In addition, in the layered body of the present invention, the first hard coat layer may contain a surfactant (levelling agent) as required in order to improve coating properties of a composition at the time of forming the first hard coat layer.

If the levelling agent is excessively added, bubbles may be generated in an applied film during formation of the first hard coat layer, thus causing defects, or the second hard coat layer may be repellent or adhesiveness may be deteriorated when laminating the second hard coat layer.

Further, if an applied film is nonuniform, or has unevenness or defects in forming the first hard coat layer, cracks or fractures may be produced in the folding-durable test.

The hard coat layer can be formed, for example, by using the composition for a hard coat layer prepared by adding the above resin component, and reactive silica fine particles/a ultraviolet ray absorber/other components.

The composition for a hard coat layer may contain a solvent as required.

Examples of the solvent include alcohols (e.g., methanol, ethanol, propanol, isopropanol, n-butanol, s-butanol, t-butanol, benzyl alcohol, PGME, ethylene glycol, diacetone alcohol), ketones (e.g., acetone, methyl ethyl ketone, methyl isobutyl ketone, cyclopentanone, cyclohexanone, heptanone, diisobutyl ketone, diethyl ketone, diacetone alcohol), esters (methyl acetate, ethyl acetate, butyl acetate, n-propyl acetate, isopropyl acetate, methyl formate, PGMEA), aliphatic hydrocarbons (e.g., hexane, cyclohexane), halogenated hydrocarbons (e.g., methylene chloride, chloroform, carbon tetrachloride), aromatic hydrocarbons (e.g., benzene, toluene, xylene), amides (e.g., dimethylformamide, dimethylacetamide, n-methylpyrrolidone), ethers (e.g., diethyl ether, dioxane, tetrahydrofuran), ether alcohols (e.g., 1-methoxy-2-propanol), carbonates (dimethyl carbonate, diethyl carbonate, ethyl methyl carbonate), and the like. These solvents may be used singly, or may be used in combination of two or more thereof.

Among these solvents, methyl isobutyl ketone and methyl ethyl ketone are preferred as the solvent in that resin components such as the above-mentioned polymerizable monomer and/or polymerizable oligomer as well as other additives can be dissolved or dispersed in these solvents, and the composition for a hard coat layer containing these solvents can be suitably coated.

A total solid content of the composition for a hard coat layer is preferably 25% to 55%. When the total solid content is lower than 25%, there is a possibility that a residual solvent is left or whitening occurs. When the total solid content is higher than 55%, viscosity of the composition for a hard coat layer is increased, deteriorating coating properties, and therefore unevenness or streak may be produced on the surface. The solid content is more preferably 30% to 50%.

Examples of a method for producing the layered body of the present invention using the composition for a hard coat layer include a method in which a composition for a hard coat layer is applied onto one surface of the substrate film to form an applied layer, and the applied layer is dried and then cured.

Examples of a method of applying the composition for a hard coat layer onto one surface of the substrate film to form an applied layer include various publicly known methods such as a spin coating method, a dip coating method, a spray coating method, a die coating method, a bar coating method, a roller coating method, a meniscus coating method, a flexography method, a screen printing method, and a bead coating method.

A method of drying the applied film is not particularly limited, and the applied film may be generally dried at 30° C. to 120° C. for 10 to 120 seconds.

Further, as a method of curing the applied film, a publicly known method may be appropriately selected according to the composition of the composition for a hard coat layer. For example, when the composition for a hard coat layer is an ultraviolet ray-cured type, the applied film may be cured by irradiating the applied film with ultraviolet rays.

In addition, when the hard coat layer is configured to have the above-mentioned first hard coat layer and second hard coat layer, a composition for a first hard coat layer prepared for forming the first hard coat layer is applied onto the substrate film to form an applied film, and the applied film is dried and half-cured. By forming a second hard coat layer described later in a state in which the applied film is not completely cured and is half-cured, the adhesiveness between the first hard coat layer and the second hard coat layer becomes extremely excellent. Examples of half-curing the applied film include a method of irradiating the dried applied film with ultraviolet rays of 100 mJ/cm$^2$ or less.

A composition for a second hard coat layer prepared for forming the second hard coat layer is applied onto the half-cured first hard coat layer to form an applied film, and then the applied film is dried and completely cured, and thereby, the second hard coat layer can be formed on the first hard coat layer. In addition, by completely curing the applied film using the composition for a second hard coat layer, the steel wool resistance of the surface of the hard coat layer (second hard coat layer) becomes excellent. Examples of a method of completely curing the applied film of the composition for a second hard coat layer include a method of curing the applied film by irradiation of ultraviolet rays in a nitrogen atmosphere (an oxygen concentration is preferably 500 ppm or less, more preferably 200 ppm or less, and even more preferably 100 ppm or less). Further, the steel wool resistance can also be improved by increasing a degree of crosslinking (reaction ratio) of a surface on a side opposite to the first hard coat layer side of the second hard coat layer serving as the outermost surface.

In addition, when the first hard coat layer and the second hard coat layer are formed by the above-mentioned method, an amount of ultraviolet irradiation is preferably 150 mJ/cm$^2$ or more as a whole in order to obtain an adequately cured hard coat layer (the first hard coat layer and the second hard coat layer).

In the present invention, the hard coat layer may be one formed by using a publicly known thermosetting sol-gel method.

In addition, as the thermosetting sol-gel method, commonly known is a method in which an alkoxysilane compound having an epoxy group is generally hydrolyzed, formed into a gel which lost flowability by a polycondensation reaction, and the gel is heated to obtain an oxide, and as others, for example, a method of hydrolyzing and polycondensating an alkoxysilane compound to obtain an oxide, a method of polycondensating an alkoxysilane compound having an isocyanate group by heating to obtain an oxide, or a method of mixing the alkoxysilane compound with a compound having an isocyanate group in an arbitrary ratio and hydrolyzing the resulting mixture to cause a polycondensation reaction may be employed.

The alkoxysilane compound having an epoxy group is not particularly limited as long as it has each of at least one epoxy group and at least one hydrolyzing silicon group in a molecule, and examples thereof include γ-glycidoxypropyltrimethoxysilane, γ-glycidoxypropyltriethoxysilane, β-(3,4-epoxycyclohexyl)ethyltrimethoxysilane, β-(3,4-epoxycyclohexyl)ethyltriethoxysilane, and the like.

A hydrolysate of the alkoxysilane compound having an epoxy group can be prepared by dissolving the alkoxysilane compound having an epoxy group in an appropriate solvent to hydrolyze the compound. Examples of the solvent to be used include alcohols, ketones and esters, such as methyl ethyl ketone, isopropyl alcohol, methanol, ethanol, methyl isobutyl ketone, ethyl acetate and butyl acetate; halogenated hydrocarbons; aromatic hydrocarbons such as toluene and xylene; and mixtures thereof. Among these solvents, methyl ethyl ketone is preferred in point of having a drying rate suitable for formation of a film.

When the hydrolysis is performed, a catalyst may be used as required. A catalyst to be used is not particularly limited, and publicly known acid catalysts or base catalysts can be used.

Examples of the acid catalysts include organic acids such as acetic acid, chloroacetic acid, citric acid, benzoic acid, dimethyl malonate, formic acid, propionic acid, glutaric acid, glycolic acid, malonic acid, maleic acid, toluenesulfonic acid and oxalic acid; inorganic acids such as hydrochloric acid, nitric acid and halogenated silane; acidic gel-like fillers such as acidic colloidal silica and titania sol. These compounds may be used singly or may be used in combination of two or more thereof.

Examples of the base catalysts include aqueous solutions of hydroxides of alkali metal or alkaline earth metal such as sodium hydroxide and calcium hydroxide, ammonia water, aqueous solutions of amines, and the like. Among these, hydrochloric acid and acetic acid each having high efficiency of a catalyst reaction are preferably used.

Further, the alkoxysilane compound is not particularly limited, and examples thereof include tetramethoxysilane, tetraethoxysilane, tetraisopropoxysilane, tetrabuthoxysilane, methyltrimethoxysilane, methyltriethoxysilane, methyl-tri-isopropoxy-silane, methyl tributhoxy silane, ethyltrimethoxysilane, ethyltriethoxysilane, ethyl triisopropoxy silane, ethyl tributhoxy silane, dimethyldimethoxysilane, dimethyldiethoxysilane, dimethydiisopropoxysilane, dimethyldibuthoxysilane, diethyldimethoxysilane, diethyldiethoxysilane, diethydiisopropoxysilane, diethyldibuthoxysilane, vinyltrimethoxysilane, vinyltriethoxysilane, γ-methacryloxypropyltrimethoxysilane, γ-chloropropyltrimethoxysilane, γ-mercaptopropyltrimethoxysilane and the like.

These silane compounds may be used in combination of two or more thereof.

Further, the above-mentioned alkoxysilane compound having an isocyanate group is not particularly limited, and examples thereof include 3-isocyanatepropyltriethoxysilane, 3-isocyanatepropyltrimethoxysilane, and tri-n-propoxy (2-isocyanatoethyl)silane, and the like.

Further, the alkoxysilane compound having an isocyanate group is not particularly limited, and examples thereof include trilene diisocyanate (TDI), 3,3'-trilene-4,4'-isocyanate, diphenylmethane 4,4'-diisocyanate (MDI), triphenylmethane p,p',p''-triisocyanate (T.M), 2,4-trilene dimer (TT), 1,5-naphthalene diisocyanate, tris(4-isocyanatophenyl)thiophosphate, crude (MDI), TDI trimer, dicyclohexylmethane 4,4'-diisocyanate (HMDI), hydrogenated TDI (HTDI), methxylylene diisocyanate (XDI), hexahydromethxylylene diisocyanate (HXDI), hexamethylene diisocyanate, trimethylpropane-1-methyl-2-isocyano-4-carbamate, polymethylene polyphenyl isocyanate, 3,3'-dimethoxy-4,4'-diphenyl diisocyanate, diphenyl ether 2,4,1'-triisocyanate, m-xylylene diisocyanate (MXDI), and polymethylene polyphenyl isocyanate (DAPI).

The hard coat layer may have a projection and depression shape on a surface on a side opposite to the substrate film, or may have no projection and depression shape; however, the hard coat layer preferably has a projection and depression shape on a surface on a side opposite to the substrate film from the viewpoint of improving visibility such as prevention of reflection due to external light or prevention of screen glare.

In the hard coat layer having the projection and depression shape, the first hard coat layer may have a projection and depression shape on a surface on aside opposite to the substrate film, or the second hard coat layer may have a projection and depression shape on a surface on a side opposite to the substrate film.

The projection and depression shape of the hard coat layer preferably satisfies the following formulas when an average spacing between projections and depressions on a surface on a side opposite to the substrate film in the hard coat layer is denoted by Sm, an average angle of inclination of a projection and depression portion is denoted by θa, and an arithmetic average roughness of the projections and depressions is denoted by Ra.

30 μm<Sm<90 μm,
2<θa<15,
0.5 μm<Ra<1.5 μm

The Sm, θa and Ra are values obtained by a method according to JIS B 0601 (1994), and can be determined by measuring with a surface roughness meter: SE-3400 (manufactured by Kosaka Laboratory Ltd.).

The projection and depression shape of the hard coat layer preferably satisfies the following formulas when an average spacing between projections and depressions on a surface on a side opposite to the substrate film in the hard coat layer is denoted by Sm, an average angle of inclination of a projection and depression portion is denoted by θa, and an arithmetic average roughness of the projections and depressions is denoted by Ra.

Sm: preferably 30 μm<Sm<600 μm
more preferably 30 μm<Sm<90 μm
θa: preferably 0.1<θa<1.2
more preferably 0.1<θa<0.5
Ra: preferably 0.02 μm<Ra<1.0 μm
more preferably 0.02 μm<Ra<0.20 μm The Sm, θa and Ra are values obtained by a method according to JIS B 0601 (1994), and can be determined by measuring with a surface roughness meter: SE-3400 (manufactured by Kosaka Laboratory Ltd.).

The projection and depression shape on a surface on a side opposite to the substrate film in the hard coat layer may be a shape formed by a composition containing an antiglare agent, a shape formed by phase separation of a resin, or a shape formed by embossing.

Among these, the projection and depression shape on a surface on a side opposite to the substrate film in the hard coat layer is preferably a shape formed by a composition for a hard coat layer containing an antiglare agent.

The antiglare agent is in the form of fine particles, and the shape of a particle is not particularly limited, and examples thereof include a perfectly spherical shape, an ellipse, an indefinite shape and the like. Further, as the antiglare agent, inorganic fine particles and organic fine particles can be used, and transparent fine particles are preferred.

Specific examples of the organic fine particle include a plastic bead. Examples of the plastic bead include a polystyrene bead (refractive index 1.60), a melamine bead (refractive index 1.57), an acryl bead (refractive index 1.49 to 1.53), an acryl-styrene copolymer bead (refractive index 1.54 to 1.58), a benzoguanamine-formaldehyde condensate bead (refractive index 1.66), a melamine-formaldehyde condensate (refractive index 1.66), a polycarbonate bead (refractive index 1.57), a polyethylene bead (refractive index 1.50), and the like. The plastic bead preferably has a hydrophobic group on its surface, and examples thereof include a polystyrene bead.

Examples of the inorganic fine particles include an inorganic silica bead having a specific shape such as indefinite shape silica and a spherical shape.

Among these, the acryl-styrene copolymer bead and/or the indefinite shape silica are preferably used.

An average particle diameter of the antiglare agent is preferably 1 to 10 μm, and more preferably 3 to 8 μm. The average particle diameter is a value obtained by measuring with a particle size distribution analyzer based on a laser diffraction and scattering method in a state of a 5 wt % toluene dispersion.

The content of the antiglare agent is preferably 1 to 40 parts by mass, and more preferably 5 to 30 parts by mass, with respect to 100 parts by mass of a binder resin solid content.

Further, the hard coat layer having a projection and depression shape on a surface on a side opposite to the substrate film preferably further contains internal scattering particles. The internal scattering particles can impart internal haze and suppress surface glare (scintillation).

Examples of the internal scattering particles include organic particles which have relatively large difference in refractive index from the binder resin constituting the hard coat layer, including plastic beads such as an acryl-styrene copolymer bead (refractive index 1.54 to 1.58), a melamine bead (refractive index 1.57), a polystyrene bead (refractive index 1.60), a polyvinyl chloride bead (refractive index 1.60), a benzoguanamine-formaldehyde condensate bead (refractive index 1.66), and a melamine-formaldehyde condensate (refractive index 1.66).

As these particles, one combining properties as the antiglare agent with properties as the internal scattering particles may be used.

An average particle diameter of the internal scattering particles is preferably 0.5 to 10 μm, and more preferably 1 to 8 μm. The average particle diameter is a value obtained by measuring with a particle size distribution analyzer based on a laser diffraction and scattering method in a state of a 5 wt % toluene dispersion.

The amount of the internal scattering particles to be added is preferably 0.1 to 40 wt %, more preferably 1 to 30 wt %, with respect to 100 parts by mass of a binder resin solid content.

Examples of a binder resin of the hard coat layer having a projection and depression shape on a surface on a side opposite to the substrate film include the same one as in the above-mentioned binder resins which can be used for the hard coat layer.

The hard coat layer having a projection and depression shape on a surface on a side opposite to the substrate film, may further contain other components, as required, to such an extent that an effect of the present invention is not impaired. Examples of the other components include the same one as in the above-mentioned other components which can be used for the hard coat layer.

The hard coat layer having a projection and depression shape on a surface on a side opposite to the substrate film may be formed by a publicly known method. Such a hard coat layer can be formed by a publicly known method, for example, by mixing/dispersing a binder resin, an antiglare agent and other components in a solvent to prepare a composition for a hard coat layer. Examples of a preparation method of the above-mentioned composition for a hard coat layer and a method of forming a hard coat layer using the composition for a hard coat layer include the same methods as in the reparation method of the composition for a hard coat layer and the method of forming the hard coat layer which are respectively described above.

A layer thickness of the hard coat layer having a projection and depression shape on a surface on aside opposite to the substrate film is preferably 1 to 10 μm. When the thickness is less than 1 μm, there is a possibility that antiglare properties cannot be suitably imparted. When the thickness is more than 10 μm, there is a possibility that curls or cracks are produced.

The layer thickness is a value obtained by measuring a cross-section of the layered body of the present invention through the observation with an electron microscope (SEM, TEM, STEM).

The layered body of the present invention preferably further has an electroconductive layer.

The electroconductive layer preferably includes, for example, conductive fibrous fillers as a conducting agent.

The conductive fibrous filler preferably has a fiber diameter of 200 nm or less and a fiber length of 1 μm or more.

When the fiber diameter is more than 200 nm, a haze value of an electroconductive layer to be produced may increase or a light-transmitting property may be insufficient. A preferred lower limit of the fiber diameter of the conductive fibrous filler is 10 nm from the viewpoint of electrical conductivity of the electroconductive layer, and a more preferred range of the fiber diameter is 10 to 180 nm.

When the fiber length of the conductive fibrous filler is less than 1 μm, since sometimes an electroconductive layer having sufficient electrical conductivity cannot be formed and there is a possibility that aggregation occurs, leading to an increase in a haze value or a reduction in a light-transmitting property, a preferred upper limit of the fiber length is 500 μm, a more preferred range is 3 to 300 μm, and an even more preferred range is 10 to 30 μm.

In addition, each of the fiber diameter and the fiber length of the conductive fibrous filler can be determined as an average at 10 locations in which the fiber diameter and the fiber length of the conductive fibrous filler are measured at a magnification of 1000 times to 500,000 times using an electron microscope such as SEM, STEM or TEM.

The conductive fibrous filler is preferably at least one selected from, for example, the group consisting of conductive carbon fibers, metal fibers and metal-covered synthetic fibers.

Examples of the conductive carbon fibers include vapor growth carbon fibers (VGCF), carbon nanotubes, wire cups, wire walls, and the like. These conductive carbon fibers may be used singly or may be used in combination of two or more thereof.

As the metal fibers, fibers prepared by, for example, a cutting method or a wire drawing method in which stainless steel, iron, gold, silver, aluminum, nickel, titanium or the like is drawn thinly and long, can be used. Such metal fibers may be used singly or may be used in combination of two or more thereof. Among these metal fibers, metal fibers using silver are preferred because of high electrical conductivity.

Examples of the metal-covered synthetic fibers include fibers obtained by coating acrylic fibers with gold, silver, aluminum, nickel, titanium or the like. Such metal-covered synthetic fibers may be used singly or may be used in combination of two or more thereof. Among these metal-covered synthetic fibers, metal-covered synthetic fibers using silver are preferred because of high electrical conductivity.

The content of the conductive fibrous filler in the electroconductive layer is preferably, for example, 20 to 3000 parts by mass with respect to 100 parts by mass of the resin component constituting the electroconductive layer. When the content of the conductive fibrous filler is less than 20 parts by mass, sometimes an electroconductive layer having sufficient electrical conductivity cannot be formed, and when the content is more than 3000 parts by mass, a haze value of the layered body of the present invention may increase or a light-transmitting property may be insufficient. Further, when a binder resin amount entering a contact of the conductive fibrous fillers is increased, conduction of the electroconductive layer is deteriorated, and therefore sometimes the layered body of the present invention cannot achieve targeted resistance. A more preferred lower limit of the content of the conductive fibrous filler is 50 parts by mass and a more preferred upper limit is 1000 parts by mass.

In addition, the resin component of the electroconductive layer is not particularly limited, and examples thereof include publicly known materials.

Examples of other conducting agents other than the conductive fibrous filler include quaternary ammonium salt, pyridinium salt, various cationic compounds having a cationic group such as primary to tertiary amino groups; anionic compounds having an anionic group such as sulfonate group, sulfate group, phosphate group and phosphonate group; amphoteric compounds such as amini acid base and amino sulfate ester base; nonionic compounds such as amino alcohol base, glycerin base and polyglycol base; organic metallic compounds such as alkoxide of tin and titanium; and metal chelate compounds such as acetyl acetonate of the organic metallic compounds; compounds obtained by increasing a molecular weight of the above-mentioned compounds; monomers or oligomers which have a tertiary amino group, a quaternary ammonium group or a metal chelate moiety and can be polymerized by ionizing radiation; and polymerizable compounds having a functional group which can be polymerized by ionizing radiation such as organic metallic compound like a coupling agent.

The content of the above-mentioned other conducting agents is preferably 1 to 50 parts by mass with respect to 100 parts by mass of the resin component constituting the electroconductive layer. When the content of the conducting agent is less than 1 part by mass, sometimes an electroconductive layer having sufficient electrical conductivity cannot be formed, and when the content is more than 50 parts by mass, a haze value of the layered body of the present invention may increase or a light-transmitting property may be insufficient.

Moreover, as the conducting agent, for example, conductive fine particles can also be used.

Specific examples of the conductive fine particles include fine particles made of a metal oxide. Examples of such a metal oxide include ZnO (refractive index 1.90, hereinafter, numerical value in the parenthesis represents a refractive index), $CeO_2$ (1.95), $Sb_2O_3$ (1.71), $SnO_2$ (1.997), indium tin oxide often abbreviated as ITO (1.95), $In_2O_3$ (2.00), $Al_2O_3$ (1.63), tin oxide doped with antimony (abbreviation, ATO; 2.0), zinc oxide doped with aluminum (abbreviation, AZO; 2.0), and the like. An average particle diameter of the conductive fine particles is preferably 0.1 nm to 0.1 μm. When the average particle diameter is in this range, a composition capable of forming a highly transparent film which has little haze and is excellent in total light transmittance is obtained in the case where the conductive fine particles are dispersed in a raw material of the resin component constituting the electroconductive layer.

The content of the conductive fine particles is preferably 10 to 400 parts by mass with respect to 100 parts by mass of the resin component constituting the electroconductive layer. When the content of the conductive fine particles is less than 10 parts by mass, sometimes an electroconductive layer having sufficient electrical conductivity cannot be formed, and when the content is more than 400 parts by mass, a haze value of the layered body of the present invention may increase or a light-transmitting property may be insufficient.

As the conducting agent, for example, aromatic conjugated poly(p-phenylene); heterocyclic conjugated polypyrrole and polythiophene; aliphatic conjugated polyacetylene; heteroatom-containing conjugated polyaniline; mixed type conjugated poly(phenylenevinylene); multichain type conjugated system which is a conjugated system having a plurality of conjugated chain in a molecule; and conducting agents obtained by increasing a molecular weight such as conductive complexes which are polymers formed by graft copolymerizing or block-copolymerizing the above-mentioned conjugated polymer chain to a saturated polymer can also be used.

The electroconductive layer may contain refractive index adjusting particles.

Examples of the refractive index adjusting particle include a high refractive index fine particle and a low refractive index fine particle.

The high refractive index fine particle is not particularly limited, and examples thereof include fine particles composed of a material having high refractive index such as resins having high refractive index in which an aromatic ring, a sulfur atom or a bromine atom is contained in resin materials such as an aromatic polyimide resin, an epoxy resin, a (meth)acrylic resin (acrylate or methacrylate compounds), a polyester resin and a urethane resin, as well as precursors thereof, and metal oxide fine particles and metallic alkoxide fine particles.

The low refractive index fine particle is not particularly limited, and examples thereof include fine particles composed of a material having low refractive index such as resins having low refractive index in which a fluorine atom is contained in resin materials such as an epoxy resin, a (meth)acrylic resin, a polyester resin and a urethane resin, as well as precursors thereof, or magnesium fluoride fine particles, and (organic and inorganic) hollow or porous fine particles.

Examples of a method of forming the electroconductive layer include a method of laminating an electroconductive layer by a common coating method, a method of laminating an overcoat layer on the electroconductive layer at a level where an aimed resistance value is obtained, and a method of having a transfer step of transferring the electroconductive layer on the hard coat layer as a transfer object using a transfer film having at least the electroconductive layer on a release film. When a resistance value of the layered body of the present invention is more reduced, the layered body is preferably produced by the method having a transfer step of transferring the electroconductive layer on a transfer object.

In the transfer step, a transfer film having at least the electroconductive layer on a release film is used.

As the above-mentioned organic EL layer, publicly known organic EL layers can be used.

In the layered body of the present invention, a substrate used for the organic EL layer is preferably a polyimide film, an aramid film, a polyester film, a polyethylene naphthalate film, a cycloolefin film or an acrylic film.

A publicly known touch panel, phase difference film or the like may be laminated between the layered body of the present invention and the organic EL layer.

In the layered body of the present invention, a substrate used for the touch panel is preferably a polyimide film, an aramid film, a polyester film, a polyethylene naphthalate film, a cycloolefin film or an acrylic film.

Since the layered body of the present invention has the above-mentioned constitution and is not cracked or fractured in the folding-durable test, it has extremely excellent folding properties and further has excellent hardness and excellent transparency.

Such a layered body of the present invention can be used not only as a surface protection film of an image display device such as a liquid crystal display device but also as a surface protection film of a curved-surface display or a product having a curved surface, or a surface protection film of a foldable member.

Particularly, since the layered body of the present invention has extremely excellent folding properties, it is suitably used as a surface protection film of a foldable member.

Further, since the layered body of the present invention is a member used for applications such as a foldable smartphone and a foldable tablet, it preferably has antibacterial properties. A method of imparting the antibacterial properties is not particularly limited, and examples thereof include publicly known methods.

Further, the layered body of the present invention preferably has blue light cutting properties by a publicly known method. In addition, the blue light means light with a wavelength of 385 to 495 nm.

The foldable members are not particularly limited as long as they are members having a structure to be folded, and examples thereof include a foldable smartphone, a foldable touch panel, a tablet, a foldable (electronic) photo album.

A folded location in a member having a structure to be folded may be one location or a plurality of locations. A direction of folding can be optionally determined as required.

Advantageous Effects of Invention

The layered body of the present invention has the above-mentioned constitution, and therefore it serves as a layered body which is excellent in the hardness, the transparency and the folding-durable performance.

Accordingly, the layered body of the present invention can be suitably used as a surface protection film of a curved-surface display or a product having a curved surface, or a surface protection film of a foldable member.

BRIEF DESCRIPTION OF DRAWINGS

FIG. 1 is a sectional view schematically showing a folding-durable test.

DESCRIPTION OF EMBODIMENTS

Hereinafter, the present invention will be described in more detail by way of examples and comparative examples, but the present invention is not limited to these examples and comparative examples.

In addition, "part(s)" or "%" in the description refers to "part(s) by mass" or "% by mass", unless otherwise specified.

TABLE 1

|  |  | Example 1 | Example 2 | Example 3 | Example 4 | Example 5 | Example 6 | Example 7 |
|---|---|---|---|---|---|---|---|---|
| Second hard coat layer | Composition | A | A | A | A | A | A | B |
|  | Thickness (μm) | 5 | 12 | 5 | 5 | 2 | 2 | 5 |
| First hard coat layer | Composition | 1 |  | 1 | 1 | 1 | 1 | 2 |
|  | Thickness (μm) | 15 | 15 | 20 | 35 | 15 | 15 | 15 |
| Substrate film | Type | Polyimide 1 | Polyimide 1 | Polyimide 1 | Polylmide 1 | Polyimide 1 | Polyimide 2 | Polyimide 1 |
|  | Thickness (μm) | 30 | 30 | 30 | 30 | 30 | 30 | 30 |
| Backside hard coat layer (1) | Composition | — | — | — | — | — | — | — |
|  | Thickness (μm) | — | — | — | — | — | — | — |
| Backside hard coat layer (2) | Composition | — | — | — | — | — | — | — |
|  | Thickness (μm) | — | — | — | — | — | — | — |

|  |  | Example 8 | Example 9 | Example 10 | Example 11 | Example 12 | Example 13 | Example 14 |
|---|---|---|---|---|---|---|---|---|
| Second hard coat layer | Composition | C | D | A | A | A | A | E |
|  | Thickness (μm) | 5 | 5 | 5 | 5 | 5 | 5 | 5 |
| First hard coat layer | Composition | 3 | 4 | 1 | 1 | 1 | 5 | 1 |
|  | Thickness (μm) | 15 | 15 | 15 | 15 | 15 | 15 | 15 |
| Substrate film | Type | Polyimide 1 | Polyimide 1 | PET | PEN | TAC | Polyimide 1 | Polyimide 1 |
|  | Thickness (μm) | 30 | 30 | 50 | 50 | 40 | 30 | 30 |
| Backside hard coat layer (1) | Composition | — | — | — | — | — | — | — |
|  | Thickness (μm) | — | — | — | — | — | — | — |
| Backside hard coat layer (2) | Composition | — | — | — | — | — | — | — |
|  | Thickness (μm) | — | — | — | — | — | — | — |

|  |  | Example 15 | Example 16 | Example 17 | Example 18 | Example 19 | Example 20 | Example 21 |
|---|---|---|---|---|---|---|---|---|
| Second hard coat layer | Composition | G | H | A | A | A | A | A |
|  | Thickness (μm) | 5 | 5 | 5 | 5 | 5 | 5 | 5 |
| First hard coat layer | Composition | 1 | 1 | 1 | 1 | 1 | 5 | 1 |
|  | Thickness (μm) | 15 | 15 | 15 | 15 | 15 | 15 | 15 |
| Substrate film | Type | Polyimide 1 | Polyimide 1 | Polyimide 1 | Polyimide 1 | Polyimide 1 | Aramid | Polyimide 1 |
|  | Thickness (μm) | 30 | 30 | 30 | 30 | 30 | 30 | 50 |
| Backside hard coat layer (1) | Composition | — | — | 1 | 1 | A | — | — |
|  | Thickness (μm) | — | — | 3 | 3 | 2 | — | — |
| Backside hard coat layer (2) | Composition | — | — | — | A | — | — | — |
|  | Thickness (μm) | — | — | — | 2 | — | — | — |

TABLE 1-continued

|  |  | Reference Example 1 | Reference Example 2 | Reference Example 3 | Comparative Example 1 | Comparative Example 2 | Comparative Example 3 |
|---|---|---|---|---|---|---|---|
| Second hard coat layer | Composition | A | — | A | A | A | A |
|  | Thickness (μm) | 3 | — | 5 | 5 | 25 | 5 |
| First hard coat layer | Composition | 1 | 1 | — | 1 | 1 | 1 |
|  | Thickness (μm) | 3 | 15 | — | 50 | 15 | 15 |
| Substrate film | Type | Polyimide 1 | Polyimide 1 | Polyimide 1 | Polyimide 1 | Polyimide 1 | COP |
|  | Thickness (μm) | 30 | 30 | 30 | 30 | 30 | 30 |
| Backside hard coat layer (1) | Composition | — | — | — | — | — | — |
|  | Thickness (μm) | — | — | — | — | — | — |
| Backside hard coat layer (2) | Composition | — | — | — | — | — | — |
|  | Thickness (μm) | — | — | — | — | — | — |

|  |  | Comparative Example 4 | Reference Example 4 | Reference Example 5 | Comparative Example 5 |
|---|---|---|---|---|---|
| Second hard coat layer | Composition | 6 | 1 | A | A |
|  | Thickness (μm) | 5 | 5 | 5 | 5 |
| First hard coat layer | Composition | 1 | 1 | 7 | 1 |
|  | Thickness (μm) | 15 | 15 | 15 | 15 |
| Substrate film | Type | Polyimide 1 | Polyimide 1 | Polyimide 1 | Polyimide 1 |
|  | Thickness (μm) | 30 | 30 | 30 | 30 |
| Backside hard coat layer (1) | Composition | — | — | — | — |
|  | Thickness (μm) | — | — | — | — |
| Backside hard coat layer (2) | Composition | — | — | — | — |
|  | Thickness (μm) | — | — | — | — |

Example 1

A polyimide film (polyimide 1, NEOPULIM L-3450, manufactured by MITSUBISHI GAS CHEMICAL CO., INC.) having a thickness of 30 μm was prepared as a substrate film, and a composition 1 for a hard coat layer having a composition described later was applied onto one surface of the substrate film to form an applied film.

Then, the formed applied film was heated at 70° C. for 1 minute to vaporize a solvent in the applied film. Using a UV irradiation apparatus (manufactured by Fusion UV Systems Japan; light source, H bulb), the applied film was irradiated with ultraviolet rays in the air so that a cumulative light quantity was 100 mJ/cm$^2$ to half-cure the applied film, and thereby a first hard coat layer having a thickness of 15 μm was formed.

Next, a composition A for a hard coat layer having a composition described later was applied onto the first hard coat layer to form an applied film. Then, the formed applied film was heated at 70° C. for 1 minute to vaporize a solvent in the applied film. Using a UV irradiation apparatus (manufactured by Fusion UV Systems Japan; light source, H bulb), the applied film was irradiated with ultraviolet rays so that a cumulative light quantity was 200 mJ/cm$^2$ under the condition of oxygen concentration of 200 ppm or less to completely cured the applied film, and thereby a second hard coat layer having a thickness of 5 μm was formed to produce a layered body.

(Composition 1 for a Hard Coat Layer)

A mixture of dipentaerythritol pentaacrylate and dipentaerythritol hexaacrylate (M403, manufactured by Toagosei Co., Ltd.) 25 parts by mass Dipentaerythritol EO-modified hexaacrylate (A-DPH-6E, manufactured by Shin Nakamura Chemical Co., Ltd.) 25 parts by mass Deformed shape silica fine particle (average particle diameter 25 nm, manufactured by JGC Catalysts and Chemicals Ltd.) 50 parts by mass (in terms of solid)

Photo-polymerization initiator (IRGACURE 184) 4 parts by mass

Fluorine leveling agent (F568, manufactured by DIC CORPORATION) 0.2 part by mass (in terms of solid)

Solvent (MIBK) 150 parts by mass

In addition, a Martens hardness of the resulting first hard coat layer was 830 MPa.

(Composition a for a Hard Coat Layer)

Urethane acrylate (UX5000, manufactured by Nippon Kayaku Co., Ltd.) 25 parts by mass A mixture of dipentaerythritol pentaacrylate and dipentaerythritol hexaacrylate (M403, manufactured by Toagosei Co., Ltd.) 50 parts by mass Polyfunctional acrylate polymer (Acrit 8KX-012C, manufactured by Taisei Fine Chemical Co., Ltd.) 25 parts by mass (in terms of solid)

Antifouling agent (BYK-UV3500, manufactured by BYK Japan KK) 1.5 parts by mass (in terms of solid)

Photo-polymerization initiator (IRGACURE 184) 4 parts by mass

Solvent (MIBK) 150 parts by mass

In addition, a Martens hardness of the resulting second hard coat layer was 500 MPa.

Example 2

A layered body was produced in the same manner as in Example 1 except for changing the thickness of the second hard coat layer to 12 μm.

Example 3

A layered body was produced in the same manner as in Example 1 except for changing the thickness of the first hard coat layer to 20 μm.

Example 4

A layered body was produced in the same manner as in Example 1 except for changing the thickness of the first hard coat layer to 35 μm.

Example 5

A layered body was produced in the same manner as in Example 1 except for changing the thickness of the second hard coat layer to 2 μm.

Example 6

A layered body was produced in the same manner as in Example 1 except for using, as the substrate film, a polyimide film (polyimide 2, KSTD, manufactured by TOYOBO Co., Ltd.) having a thickness of 30 μm in place of the polyimide film (polyimide 1, NEOPULIM L-3450, manufactured by MITSUBISHI GAS CHEMICAL CO., INC.) having a thickness of 30 μm.

Example 7

A layered body was produced by forming a first hard coat layer and a second hard coat layer in the same manner as in Example 1 except that a composition 2 for a hard coat layer having a composition described later was used in place of the composition 1 for a hard coat layer, and a composition B for a hard coat layer having a composition described later was used in place of the composition A for a hard coat layer.

(Composition 2 for a Hard Coat Layer)

A mixture of dipentaerythritol pentaacrylate and dipentaerythritol hexaacrylate (M403, manufactured by Toagosei Co., Ltd.) 25 parts by mass Hexafunctional acrylate (MF001, manufactured by DKS Co., Ltd.) 25 parts by mass Deformed shape silica fine particle (average particle diameter 25 nm, manufactured by JGC Catalysts and Chemicals Ltd.) 50 parts by mass (in terms of solid)

Fluorine leveling agent (F568, manufactured by DIC CORPORATION) 0.2 part by mass (in terms of solid)

Photo-polymerization initiator (IRGACURE 184) 4 parts by mass

Solvent (MIBK) 150 parts by mass

In addition, a Martens hardness of the resulting first hard coat layer was 890 MPa.

(Composition B for a Hard Coat Layer)

Urethane acrylate (UX5000, manufactured by Nippon Kayaku Co., Ltd.) 50 parts by mass A mixture of dipentaerythritol pentaacrylate and dipentaerythritol hexaacrylate (M403, manufactured by Toagosei Co., Ltd.) 50 parts by mass Antifouling agent (BYK-UV3500, manufactured by BYK Japan KK) 1.5 parts by mass (in terms of solid)

Photo-polymerization initiator (IRGACURE 184) 4 parts by mass

Solvent (MIBK) 150 parts by mass

In addition, a Martens hardness of the resulting second hard coat layer was 600 MPa.

Example 8

A layered body was produced by forming a first hard coat layer and a second hard coat layer in the same manner as in Example 1 except that a composition 3 for a hard coat layer having a composition described later was used in place of the composition 1 for a hard coat layer, and a composition C for a hard coat layer having a composition described later was used in place of the composition A for a hard coat layer.

(Composition 3 for a Hard Coat Layer)

A mixture of dipentaerythritol pentaacrylate and dipentaerythritol hexaacrylate (M403, manufactured by Toagosei Co., Ltd.) 35 parts by mass Dipentaerythritol EO-modified hexaacrylate (A-DPH-6E, manufactured by Shin Nakamura Chemical Co., Ltd.) 35 parts by mass Deformed shape silica fine particle (average particle diameter 25 nm, manufactured by JGC Catalysts and Chemicals Ltd.) 30 parts by mass (in terms of solid)

Photo-polymerization initiator (IRGACURE 184) 4 parts by mass

Fluorine leveling agent (F568, manufactured by DIC CORPORATION) 0.2 part by mass (in terms of solid)

Solvent (MIBK) 150 parts by mass

In addition, a Martens hardness of the resulting first hard coat layer was 620 MPa.

(Composition C for a Hard Coat Layer)

Urethane acrylate (KRM8452, manufactured by DAICEL-ALLNEX LTD.) 100 parts by mass Antifouling agent (TEGO-RAD2600, manufactured by Evonik Japan Co., Ltd.) 1.5 parts by mass (in terms of solid)

Solvent (MIBK) 150 parts by mass

In addition, a Martens hardness of the resulting second hard coat layer was 420 MPa.

Example 9

A layered body was produced by forming a first hard coat layer and a second hard coat layer in the same manner as in Example 1 except that a composition 4 for a hard coat layer having a composition described later was used in place of the composition 1 for a hard coat layer, and a composition D for a hard coat layer having a composition described later was used in place of the composition A for a hard coat layer.

(Composition 4 for a Hard Coat Layer)

A mixture of dipentaerythritol pentaacrylate and dipentaerythritol hexaacrylate (M403, manufactured by Toagosei Co., Ltd.) 25 parts by mass Hexafunctional acrylate (MF001, manufactured by DKS Co., Ltd.) 10 parts by mass Polyfunctional acrylate polymer (PVEEA, AX-4-HC, manufactured by NIPPON SHOKUBAI CO., LTD.) 15 parts by mass (in terms of solid)

Photo-polymerization initiator (IRGACURE 184) 4 parts by mass

Deformed shape silica fine particle (average particle diameter 25 nm, manufactured by JGC Catalysts and Chemicals Ltd.) 50 parts by mass (in terms of solid)

Fluorine leveling agent (F568, manufactured by DIC CORPORATION) 0.2 part by mass (in terms of solid)

Solvent (MIBK) 150 parts by mass In addition, a Martens hardness of the resulting first hard coat layer was 800 MPa.

(Composition D for a Hard Coat Layer)

Urethane acrylate (UV7600B, manufactured by Nippon Synthetic Chemical Industry Co., Ltd.) 50 parts by mass Pentaerythritol triacrylate (M306, manufactured by Toagosei Co., Ltd.) 50 parts by mass Antifouling agent (X71-1203M) (manufactured by Shin-Etsu Chemical Co., Ltd.) 0.5 part by mass (in terms of solid)

Photo-polymerization initiator (IRGACURE 184) 4 parts by mass

Solvent (MIBK) 150 parts by mass

In addition, a Martens hardness of the resulting second hard coat layer was 600 MPa.

Example 10

A layered body was produced in the same manner as in Example 1 except for using, as the substrate film, a polyethylene terephthalate film (PET film, manufactured by Toray Industries, Inc.) having a thickness of 50 μm in place of the polyimide film (polyimide 1, NEOPULIM L-3450, manufactured by MITSUBISHI GAS CHEMICAL CO., INC.) having a thickness of 30 μm.

Example 11

A layered body was produced in the same manner as in Example 1 except for using, as the substrate film, a polyethylene naphthalate film (PEN film, manufactured by TEIJIN LIMITED) having a thickness of 50 μm in place of the polyimide film (polyimide 1, NEOPULIM L-3450, manufactured by MITSUBISHI GAS CHEMICAL CO., INC.) having a thickness of 30 μm.

Example 12

A layered body was produced in the same manner as in Example 1 except for using, as the substrate film, a triacetyl cellulose film (TAC, manufactured by FUJIFILM Corporation) having a thickness of 40 μm in place of the polyimide film (polyimide 1, NEOPULIM L-3450, manufactured by MITSUBISHI GAS CHEMICAL CO., INC.) having a thickness of 30 μm.

Example 13

A layered body was produced by forming a first hard coat layer in the same manner as in Example 1 except for using a composition 5 for a hard coat layer having the following composition in place of the composition 1 for a hard coat layer.
(Composition 5 for a Hard Coat Layer)
A mixture of dipentaerythritol pentaacrylate and dipentaerythritol hexaacrylate (M403, manufactured by Toagosei Co., Ltd.) 25 parts by mass
Dipentaerythritol EO-modified hexaacrylate (A-DPH-6E, manufactured by Shin Nakamura Chemical Co., Ltd.) 25 parts by mass
Solid silica fine particle (average particle diameter 12 nm, MIBKSD, manufactured by NISSAN CHEMICAL INDUSTRIES, LTD.) 50 parts by mass (in terms of solid)
Fluorine leveling agent (F568, manufactured by DIC CORPORATION) 0.2 part by mass (in terms of solid)
Photo-polymerization initiator (IRGACURE 184) 4 parts by mass
Solvent (MIBK) 150 parts by mass
In addition, a Martens hardness of the resulting first hard coat layer was 730 MPa.
Further, the solid silica fine particle was a spherical solid silica fine particle.

Example 14

A layered body was produced by forming a second hard coat layer in the same manner as in Example 1 except for using a composition E for a hard coat layer having the following composition in place of the composition A for a hard coat layer.
(Composition E for a Hard Coat Layer)
Urethane acrylate (UV7600B, manufactured by Nippon Synthetic Chemical Industry Co., Ltd.) 45 parts by mass
Pentaerythritol triacrylate (M306, manufactured by Toagosei Co., Ltd.) 45 parts by mass
Solid silica fine particle (average particle diameter 12 nm, MIBKSD, manufactured by NISSAN CHEMICAL INDUSTRIES, LTD.) 10 parts by mass
Antifouling agent (Optool DAC, manufactured by DAIKIN INDUSTRIES, LTD.) 0.5 part by mass (in terms of solid)
Photo-polymerization initiator (IRGACURE 184) 4 parts by mass
Solvent (MIBK) 150 parts by mass
In addition, a Martens hardness of the resulting second hard coat layer was 500 MPa.

Example 15

A layered body was produced by forming a second hard coat layer in the same manner as in Example 1 except for using a composition F for a hard coat layer having the following composition in place of the composition A for a hard coat layer.
(Composition F for a Hard Coat Layer)
Urethane acrylate (UX5000, manufactured by Nippon Kayaku Co., Ltd.) 25 parts by mass
A mixture of dipentaerythritol pentaacrylate and dipentaerythritol hexaacrylate (M403, manufactured by Toagosei Co., Ltd.) 50 parts by mass
Acrylate polymer (Acrit 8KX-012C, manufactured by Taisei Fine Chemical Co., Ltd.) 25 parts by mass
Antifouling agent (RS71, manufactured by DIC CORPORATION) 0.5 part by mass (in terms of solid)
Photo-polymerization initiator (IRGACURE 184) 4 parts by mass
Solvent (MIBK) 150 parts by mass
In addition, a Martens hardness of the resulting second hard coat layer was 500 MPa.

Example 16

A layered body was produced by forming a second hard coat layer in the same manner as in Example 1 except for using a composition G for a hard coat layer having the following composition in place of the composition A for a hard coat layer.
(Composition G for a Hard Coat Layer)
Urethane acrylate (UX5000, manufactured by Nippon Kayaku Co., Ltd.) 25 parts by mass
A mixture of dipentaerythritol pentaacrylate and dipentaerythritol hexaacrylate (M403, manufactured by Toagosei Co., Ltd.) 50 parts by mass
Acrylate polymer (Acrit 8KX-012C, manufactured by Taisei Fine Chemical Co., Ltd.) 25 parts by mass
Antifouling agent (BYK-UV3510, manufactured by BYK Japan KK) 1 part by mass (in terms of solid)
Photo-polymerization initiator (IRGACURE 184) 4 parts by mass
Solvent (MIBK) 150 parts by mass
In addition, a Martens hardness of the resulting second hard coat layer was 500 MPa.

Example 17

A first hard coat layer and a second hard coat layer were formed on a substrate film in the same manner as in Example 1, and then a backside hard coat layer (1) was formed on a surface opposite to the surface of the substrate film having the first hard coat layer and the second hard coat layer provided thereon in the same manner as in the first hard coat layer of Example 1 except for changing the thickness to 3 μm to produce a layered body.

Example 18

A backside hard coat layer (2) was formed, in the same manner as in the second hard coat layer of Example 1 except for changing the thickness to 2 μm, on a surface opposite to the substrate film of the backside hard coat layer (1) formed in the same manner as in Example 17, and thereby a layered body was produced.

Example 19

A first hard coat layer and a second hard coat layer were formed on a substrate film in the same manner as in Example 1, and then a backside hard coat layer (1) was formed on a surface opposite to the surface of the substrate film having the first hard coat layer and the second hard coat layer provided thereon in the same manner as in the second hard coat layer of Example 1 except for changing the thickness to 2 μm to produce a layered body.

Example 20

A layered body was produced in the same manner as in Example 1 except for using, as the substrate film, an aramid film (trade name: MICTRON, manufactured by Toray Industries, Inc.) having a thickness of 30 μm in place of the polyimide film (polyimide 1, NEOPULIM L-3450, manufactured by MITSUBISHI GAS CHEMICAL CO., INC.) having a thickness of 30 μm.

Example 21

A layered body was produced in the same manner as in Example 1 except for using, as the substrate film, a polyimide film (polyimide 1, NEOPULIM L-3450, manufactured by MITSUBISHI GAS CHEMICAL CO., INC.) having a thickness of 50 μm in place of the polyimide film (polyimide 1, NEOPULIM L-3450, manufactured by MITSUBISHI GAS CHEMICAL CO., INC.) having a thickness of 30 μm.

Reference Example 1

A layered body was produced in the same manner as in Example 1 except that the thickness of the first hard coat layer was changed to 3 μm and the thickness of the second hard coat layer was changed to 3 μm.

Reference Example 2

A layered body was produced in the same manner as in Example 1 except for not forming the second hard coat layer.

Reference Example 3

A layered body was produced in the same manner as in Example 1 except for not forming the first hard coat layer.

Comparative Example 1

A layered body was produced in the same manner as in Example 1 except for changing the thickness of the first hard coat layer to 50 μm.

Comparative Example 2

A layered body was produced in the same manner as in Example 1 except for changing the thickness of the second hard coat layer to 25 μm.

Comparative Example 3

A layered body was produced in the same manner as in Example 1 except for using, as the substrate film, a cycloolefin film (COP, manufactured by Zeon Corporation) having a thickness of 30 μm in place of the polyimide film (polyimide 1, NEOPULIM L-3450, manufactured by MITSUBISHI GAS CHEMICAL CO., INC.) having a thickness of 30 μm.

Comparative Example 4

A layered body was produced by forming a second hard coat layer in the same manner as in Example 1 except for using a composition 6 for a hard coat layer having the following composition in place of the composition A for a hard coat layer.
(Composition 6 for a Hard Coat Layer)
A mixture of dipentaerythritol pentaacrylate and dipentaerythritol hexaacrylate (M403, manufactured by Toagosei Co., Ltd.) 30 parts by mass
Deformed shape silica fine particle (average particle diameter 25 nm, manufactured by JGC Catalysts and Chemicals Ltd.) 70 parts by mass (in terms of solid)
Fluorine leveling agent (F568, manufactured by DIC CORPORATION) 0.2 part by mass (in terms of solid)
Photo-polymerization initiator (IRGACURE 184) 4 parts by mass
Solvent (MIBK) 150 parts by mass
In addition, a Martens hardness of the resulting second hard coat layer was 1500 MPa.

Reference Example 4

A layered body was produced by forming a second hard coat layer in the same manner as in Example 1 except for using a composition H for a hard coat layer having the following composition in place of the composition A for a hard coat layer.
(Composition H for a Hard Coat Layer)
Urethane acrylate (UX5000, manufactured by Nippon Kayaku Co., Ltd.) 25 parts by mass
A mixture of dipentaerythritol pentaacrylate and dipentaerythritol hexaacrylate (M403, manufactured by Toagosei Co., Ltd.) 50 parts by mass
Acrylate polymer (Acrit 8KX-012C, manufactured by Taisei Fine Chemical Co., Ltd.) 25 parts by mass
Solid silica fine particle (average particle diameter 12 nm, MIBKSD, manufactured by NISSAN CHEMICAL INDUSTRIES, LTD.) 10 parts by mass
Unreactive antifouling agent (F470, manufactured by DIC CORPORATION) 0.5 part by mass (in terms of solid)
Photo-polymerization initiator (IRGACURE 184) 4 parts by mass
Solvent (MIBK) 150 parts by mass
In addition, a Martens hardness of the resulting second hard coat layer was 500 MPa.

Reference Example 5

A layered body was produced by forming a first hard coat layer in the same manner as in Example 1 except for using a composition 7 for a hard coat layer having the following composition in place of the composition 1 for a hard coat layer.

(Composition 7 for a Hard Coat Layer)

Polyethylene glycol diacrylate (M240 manufactured by Toagosei Co., Ltd.) 100 parts by mass Photo-polymerization initiator (IRGACURE 184) 4 parts by mass Fluorine leveling agent (F568, manufactured by DIC CORPORATION) 0.2 part by mass (in terms of solid)

Solvent (MIBK) 150 parts by mass

In addition, a Martens hardness of the resulting first hard coat layer was 250 MPa.

Comparative Example 5

A layered body was produced in the same manner as in Example 1 except for curing an applied film by irradiating the applied film with ultraviolet rays so that a cumulative light quantity is 200 mJ/cm$^2$ under the condition of oxygen concentration of 200 ppm or less using a UV irradiation apparatus (manufactured by Fusion UV Systems Japan; light source, H bulb), as a curing condition of the first hard coat layer.

The layered bodies obtained in Examples, Comparative Examples and Reference Examples were evaluated concerning the following items. Evaluation results are shown in Table 2.

(Folding-Durable Test)

Each of the layered bodies of Examples, Comparative Examples and Reference Examples was cut to a rectangle of 30 mm×100 mm to prepare a sample. The prepared sample was attached to an endurance testing machine (DLDMLH-FU for U-shape Sliding Plate Test, manufactured by YUASA SYSTEM CO., LTD.) with a side of 30 mm fixed to the machine so that a bending radius R of the sample is 1.5 mm (diameter 3.0 mm). A test in which the entire area of the sample is folded 180 degrees with a surface on a side where the hard coat layer has been formed facing inward is repeated 100,000 times (stroke, ±30 mm; testing speed, 60 rpm), and the folding-durable performance was rated according to the following criteria.

+: Cracks are not produced in a sample

−: Cracks are produced in a sample (Pencil Hardness)

The pencil hardness of each of the layered bodies of Examples, Comparative Examples and Reference Examples was measured according to JIS K5600-5-4 (1999) (load of 1 kg).

(Steel Wool (SW) Resistance)

The outermost surface of the hard coat layer of each of the layered bodies of Examples, Comparative Examples and Reference Examples was scrubbed to and fro 3500 times at a rate of 50 mm/sec under a load of 1 kg/cm$^2$ using #0000 steel wool (trade name: BON STAR, manufactured by Nippon Steel Wool Co., Ltd.), and thereafter the presence or absence of a scuff on a surface of a hard coat layer was visually observed to be rated according to the following criteria.

+: There is no scuff

−: There is a scuff (Antifouling Property)

The outermost surface of the hard coat layer of each of the layered bodies of Examples, Comparative Examples and Reference Examples was marked with an permanent marker, and then wiping out of a mark with a cellulose non-woven cloth wiper was tried 20 times to be rated according to the following criteria.

+: Mark can be wiped out

−: Mark cannot be wiped out

TABLE 2

| | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| Folding-durable test | + | + | + | + | + | + | + | + | + | + | + |
| Pencil hardness | 7H | 8H | 9H | 9H | 7H | 7H | 7H | 7H | 7H | 7H | 7H |
| SW resistance | + | + | + | + | + | + | + | + | + | + | + |
| Antifouling property | + | + | + | + | + | + | + | + | + | + | + |

| | Example 12 | Example 13 | Example 14 | Example 15 | Example 16 | Example 17 | Example 18 | Example 19 | Example 20 | Example 21 |
|---|---|---|---|---|---|---|---|---|---|---|
| Folding-durable test | + | + | + | + | + | + | + | + | + | + |
| Pencil hardness | 7H | 7H | 7H | 7H | 7H | 8H | 8H | 8H | 7H | 8H |
| SW resistance | + | + | + | + | + | + | + | + | + | + |
| Antifouling property | + | + | + | + | + | + | + | + | + | + |

| | Reference Example 1 | Reference Example 2 | Reference Example 3 | Comparative Example 1 | Comparative Example 2 | Comparative Example 3 | Comparative Example 4 | Reference Example 4 | Reference Example 5 | Comparative Example 5 |
|---|---|---|---|---|---|---|---|---|---|---|
| Folding-durable test | + | + | + | − | − | − | − | + | + | − |
| Pencil hardness | 4H | 6H | 4H | 9H | 9H | 3H | 7H | 7H | 4H | 7H |
| SW resistance | + | − | + | + | + | + | + | − | + | + |
| Antifouling property | + | − | + | + | + | + | + | − | + | + |

As shown in Table 2, the layered bodies of Examples were excellent in the folding-durable performance, the abrasion-resistance and the antifouling property and had the excellent pencil hardness of 7H or higher.

On the other hand, the layered bodies of Comparative Examples 1 to 5 were inferior in the folding-durable performance. In addition, the layered body of Comparative Example 5 was inferior in the folding-durable performance since adhesiveness between the first hard coat layer and the second hard coat layer was poor. The layered bodies of Comparative Example 3 and Reference Examples 1 to 3 and 5 were inferior in the pencil hardness, and the layered bodies of Reference Examples 2 and 4 were inferior in the abrasion-resistance and the antifouling property.

In addition, the layered bodies of Comparative Examples 1 and 2 intensively generate curls, and produced cracks only by stretching the curl in order to perform a folding-durable test.

TABLE 3

| | | Example 22 | Example 23 | Example 24 | Example 25 | Example 26 | Example 27 | Example 28 |
|---|---|---|---|---|---|---|---|---|
| Second hard coat layer | Composition | A | A | A | A | A | A | B |
| | Thickness (μm) | 2 | 4 | 2 | 0.75 | 2 | 2 | 2 |
| First hard coat layer | Composition | 1 | 1 | 1 | 1 | 1 | 1 | 2 |
| | Thickness (μm) | 3 | 3 | 5 | 3 | 2 | 3 | 3 |
| Substrate film | Type | Polyimide 1 | Polyimide 1 | Polyimide 1 | Polyimide 1 | Polyimide 1 | Polyimide 2 | Polyimide 1 |
| | Thickness (μm) | 30 | 30 | 30 | 30 | 30 | 30 | 30 |
| Backside hard coat layer (1) | Composition | — | — | — | — | — | — | — |
| | Thickness (μm) | — | — | — | — | — | — | — |
| Backside hard coat layer (2) | Composition | — | — | — | — | — | — | — |
| | Thickness (μm) | — | — | — | — | — | — | — |

| | | Example 29 | Example 30 | Example 31 | Example 32 | Example 33 | Example 34 | Example 35 |
|---|---|---|---|---|---|---|---|---|
| Second hard coat layer | Composition | C | D | A | A | A | A | E |
| | Thickness (μm) | 2 | 2 | 2 | 2 | 2 | 2 | 2 |
| First hard coat layer | Composition | 3 | 4 | 1 | 1 | 1 | 5 | 1 |
| | Thickness (μm) | 3 | 3 | 3 | 3 | 3 | 3 | 3 |
| Substrate film | Type | Polyimide 1 | Polyimide 1 | PET | PEN | TAC | Polyimide 1 | Polyimide 1 |
| | Thickness (μm) | 30 | 30 | 25 | 50 | 25 | 30 | 30 |
| Backside hard coat layer (1) | Composition | — | — | — | — | — | — | — |
| | Thickness (μm) | — | — | — | — | — | — | — |
| Backside hard coat layer (2) | Composition | — | — | — | — | — | — | — |
| | Thickness (μm) | — | — | — | — | — | — | — |

| | | Example 36 | Example 37 | Example 38 | Example 39 | Example 40 | Example 41 | Example 42 |
|---|---|---|---|---|---|---|---|---|
| Second hard coat layer | Composition | G | H | A | A | A | A | A |
| | Thickness (μm) | 2 | 2 | 2 | 2 | 2 | 2 | 2 |
| First hard coat layer | Composition | 1 | 1 | 1 | 1 | 1 | 1 | 1 |
| | Thickness (μm) | 3 | 3 | 3 | 3 | 3 | 3 | 3 |
| Substrate film | Type | Polyimide 1 | Polyimide 1 | Polyimide 1 | Polyimide 1 | Polyimide 1 | Polyimide 3 | Polyimide 4 |
| | Thickness (μm) | 30 | 30 | 30 | 30 | 30 | 25 | 50 |
| Backside hard coat layer (1) | Composition | — | — | 1 | 1 | A | — | — |
| | Thickness (μm) | — | — | 3 | 3 | 2 | — | — |
| Backside hard coat layer (2) | Composition | — | — | — | A | — | — | — |
| | Thickness (μm) | — | — | — | 2 | — | — | — |

| | | Comparative Example 6 | Comparative Example 7 | Reference Example 6 | Comparative Example 8 | Reference Example 7 | Reference Example 8 | Comparative Example 9 |
|---|---|---|---|---|---|---|---|---|
| Second hard coat layer | Composition | A | A | A | — | A | A | 1 |
| | Thickness (μm) | 2 | 8 | 0.5 | — | 2 | 2 | 3 |
| First hard coat layer | Composition | 1 | 1 | 1 | 1 | 1 | — | A |
| | Thickness (μm) | 10 | 3 | 3 | 3 | 0.5 | — | 2 |
| Substrate film | Type | Polyimide 1 | Polyimide 1 | Polyimide 1 | Polyimide 1 | Polyimide 1 | Polyimide 1 | Polyimide 1 |
| | Thickness (μm) | 30 | 30 | 30 | 30 | 30 | 30 | 30 |
| Backside hard coat layer (1) | Composition | — | — | — | — | — | — | — |
| | Thickness (μm) | — | — | — | — | — | — | — |
| Backside hard coat layer (2) | Composition | — | — | — | — | — | — | — |
| | Thickness (μm) | — | — | — | — | — | — | — |

| | | Comparative Example 10 | Comparative Example 11 | Reference Example 9 | Comparative Example 12 | Reference Example 10 | Comparative Example 13 | Comparative Example 14 |
|---|---|---|---|---|---|---|---|---|
| Second hard coat layer | Composition | — | A | A | A | A | 6 | F |
| | Thickness (μm) | — | 15 | 2 | 2 | 2 | 2 | 2 |
| First hard coat layer | Composition | 1 | — | 1 | 6 | 7 | 1 | 1 |
| | Thickness (μm) | 15 | — | 3 | 3 | 3 | 3 | 3 |
| Substrate film | Type | Polyimide 1 | Polyimide 1 | COP | Polyimide 1 | Polyimide 1 | Polyimide 1 | Polyimide 1 |
| | Thickness (μm) | 30 | 30 | 25 | 30 | 30 | 30 | 30 |
| Backside hard coat layer (1) | Composition | — | — | — | — | — | — | — |
| | Thickness (μm) | — | — | — | — | — | — | — |
| Backside hard coat layer (2) | Composition | — | — | — | — | — | — | — |
| | Thickness (μm) | — | — | — | — | — | — | — |

TABLE 3-continued

|  |  | Reference Example 11 | Reference Example 12 | Reference Example 13 | Comparative Example 15 | Comparative Example 16 |
|---|---|---|---|---|---|---|
| Second hard coat layer | Composition | J | 7 | A | A | A |
|  | Thickness (μm) | 2 | 50 | 2 | 2 | 2 |
| First hard coat layer | Composition | 1 | 1 | 7 | 1 | 1 |
|  | Thickness (μm) | 3 | 3 | 50 | 3 | 3 |
| Substrate film | Type | Polyimide 1 | Polyimide 1 | Polyimide 1 | PET2 | Polyimide 1 |
|  | Thickness (μm) | 30 | 30 | 30 | 188 | 30 |
| Backside hard coat layer (1) | Composition | — | — | — | — | — |
|  | Thickness (μm) | — | — | — | — | — |
| Backside hard coat layer (2) | Composition | — | — | — | — | — |
|  | Thickness (μm) | — | — | — | — | — |

Examples 22 to 42, Comparative Examples 6 to 16, and Reference Examples 6 to 13

Layered bodies were produced in the same manner as in Example 1 except for changing so as to have the composition and thicknesses shown in Table 3.

In addition, in Examples 38 to 40, a backside hard coat layer was formed, in the same manner as in the first hard coat layer, on a surface opposite to the surface of the substrate film having the first hard coat layer and the second hard coat layer provided thereon.

Further, a composition I for a hard coat layer of the second hard coat layer of Comparative Example 14 is as follows.

(Composition I for a Hard Coat Layer)
A mixture of dipentaerythritol pentaacrylate and dipentaerythritol hexaacrylate (M403, manufactured by Toagosei Co., Ltd.) 90 parts by mass
Deformed shape silica fine particle (average particle diameter 25 nm, manufactured by JGC Catalysts and Chemicals Ltd.) 10 parts by mass (in terms of solid)
Photo-polymerization initiator (IRGACURE 184) 4 parts by mass
Solvent (MIBK) 150 parts by mass
In addition, a Martens hardness of the resulting second hard coat layer was 650 MPa.

The layered bodies obtained in Examples and Comparative Examples were evaluated in the same manner as in Example 1 concerning the folding-durable test, the pencil hardness, the steel wool (SW) resistance and the antifouling property. Evaluation results are shown in Table 4.

TABLE 4

|  | Example 22 | Example 23 | Example 24 | Example 25 | Example 26 | Example 27 | Example 28 |
|---|---|---|---|---|---|---|---|
| Folding-durable test | + | + | + | + | + | + | + |
| Pancil hardness | 6H | 6H | 7H | 5H | 6H | 6H | 7H |
| SW resistance | + | + | + | + | + | + | + |
| Antifouling property | + | + | + | + | + | + | + |

|  | Example 29 | Example 30 | Example 31 | Example 32 | Example 33 | Example 34 | Example 35 |
|---|---|---|---|---|---|---|---|
| Folding-durable test | + | + | + | + | + | + | + |
| Pancil hardness | 6H | 6H | 4H | 5H | 4H | 5H | 6H |
| SW resistance | + | + | + | + | + | + | + |
| Antifouling property | + | + | + | + | + | + | + |

|  | Example 36 | Example 37 | Example 38 | Example 39 | Example 40 | Example 41 | Example 42 |
|---|---|---|---|---|---|---|---|
| Folding-durable test | + | + | + | + | + | + | + |
| Pancil hardness | 6H | 6H | 6H | 6H | 6H | 6H | 7H |
| SW resistance | + | + | + | + | + | + | + |
| Antifouling property | + | + | + | + | + | + | + |

|  | Comparative Example 6 | Comparative Example 7 | Reference Example 6 | Comparative Example 8 | Reference Example 7 | Reference Example 8 | Comparative Example 9 |
|---|---|---|---|---|---|---|---|
| Folding-durable test | − | − | + | − | + | + | − |
| Pancil hardness | 7H | 6H | 5H | 5H | 4H | 4H | 6H |
| SW resistance | + | + | − | − | − | − | − |
| Antifouling property | + | + | + | + | + | + | + |

TABLE 4-continued

|  | Comparative Example 10 | Comparative Example 11 | Reference Example 9 | Comparative Example 12 | Reference Example 10 | Comparative Example 13 | Comparative Example 14 |
|---|---|---|---|---|---|---|---|
| Folding-durable test | − | − | + | − | + | − | − |
| Pancil hardness | 9H | 5H | B | 4H | H | 3H | 6H |
| SW resistance | − | − | + | − | + | − | + |
| Antifouling property | + | + | + | + | + | + | + |

|  |  | Reference Example 11 | Reference Example 12 | Reference Example 13 | Comparative Example 15 | Comparative Example 16 |
|---|---|---|---|---|---|---|
|  | Folding-durable test | + | + | + | − | − |
|  | Pancil hardness | 6H | 3H | 3H | 6H | 3H |
|  | SW resistance | − | − | + | + | − |
|  | Antifouling property | − | + | + | + | + |

As shown in Table 4, the layered bodies of Examples were excellent in the folding-durable performance, the abrasion-resistance and the antifouling property and had the excellent pencil hardness of 4H or higher.

On the other hand, the layered bodies of Comparative Examples 6 to 16 were inferior in the folding-durable performance, the layered bodies of Comparative Examples 13 and 16, and Reference Examples 9, 10, 12 and 13 were inferior in the pencil hardness, the layered bodies of Comparative Examples 8 to 13 and 16, and Reference Examples 6 to 8, 11 and 12 were inferior in the abrasion-resistance, and the layered body of Reference Example 11 was inferior in the antifouling property.

In addition, the layered body of Comparative Example 15 was inferior in handleability since the substrate film thereof was thick and much heavier than the layered bodies of other Examples and Comparative Examples.

Further, although the layered body of Comparative Example 16 was similar in the composition of the substrate film, the first hard coat layer, and the second hard coat layer to the layered body of Example 22, the layered body had poor adhesiveness between the first hard coat layer and the second hard coat layer, resulting in inferior pencil hardness, and easily produced peeling off at an interface between the first hard coat layer and the second hard coat layer, resulting in inferior folding-durable performance and abrasion-resistance, because of forming the second hard coat layer after completely curing the first hard coat layer.

TABLE 5

|  |  | Example 43 | Example 44 | Example 45 | Example 46 | Example 47 |
|---|---|---|---|---|---|---|
| Second hard coat layer | Composition | A | A | A | A | A |
|  | Thickness (μm) | 2 | 2 | 2 | 2 | 2 |
| First hard coat layer | Composition | 1 | 1 | 1 | 1 | 1 |
|  | Thickness (μm) | 3 | 3 | 3 | 3 | 3 |
| hardened layer of monofunctional monomer | Type | a | a | a | a | a |
|  | Thickness (μm) | 2 | 5 | 8 | 1 | 0.5 |
| Substrate film | Type | Polyimide 1 | Polyimide 1 | Polyimide 1 | Polyimide 1 | Polyimide 1 |
|  | Thickness (μm) | 30 | 30 | 30 | 30 | 30 |

|  |  | Example 48 | Example 49 | Example 50 | Example 51 | Example 52 |
|---|---|---|---|---|---|---|
| Second hard coat layer | Composition | A | A | A | A | B |
|  | Thickness (μm) | 4 | 2 | 0.75 | 2 | 2 |
| First hard coat layer | Composition | 1 | 1 | 1 | 1 | 2 |
|  | Thickness (μm) | 3 | 5 | 3 | 2 | 3 |
| hardened layer of monofunctional monomer | Type | a | a | a | a | a |
|  | Thickness (μm) | 2 | 2 | 2 | 2 | 2 |
| Substrate film | Type | Polyimide 1 | Polyimide 1 | Polyimide 1 | Polyimide 1 | Polyimide 1 |
|  | Thickness (μm) | 30 | 30 | 30 | 30 | 30 |

|  |  | Example 53 | Example 54 | Example 55 | Example 56 |
|---|---|---|---|---|---|
| Second hard coat layer | Composition | C | D | E | A |
|  | Thickness (μm) | 2 | 2 | 2 | 4 |
| First hard coat layer | Composition | 3 | 4 | 5 | 1 |
|  | Thickness (μm) | 3 | 3 | 3 | 5 |
| hardened layer of monofunctional monomer | Type | a | a | a | a |
|  | Thickness (μm) | 2 | 2 | 2 | 2 |
| Substrate film | Type | Polyimide 1 | Polyimide 1 | Polyimide 1 | Polyimide 1 |
|  | Thickness (μm) | 30 | 30 | 30 | 30 |

TABLE 5-continued

|  |  | Reference Example 14 | Reference Example 15 | Reference Example 16 | Reference Example 17 | Comparative Example 17 |
|---|---|---|---|---|---|---|
| Second hard coat layer | Composition | A | A | A | A | A |
|  | Thickness (μm) | 2 | 2 | 2 | 2 | 2 |
| First hard coat layer | Composition | 1 | 1 | 1 | 1 | 1 |
|  | Thickness (μm) | 3 | 3 | 3 | 3 | 3 |
| Hardened layer | Type | — | a | b | c | a |
|  | Thickness (μm) | — | 0.2 | 2 | 2 | 2 |
| Substrate film | Type | Polyimide 1 | Polyimide 1 | Polyimide 1 | Polyimide 1 | Polyimide 1 |
|  | Thickness (μm) | 30 | 30 | 30 | 30 | 30 |

|  |  | Reference Example 18 | Reference Example 19 | Reference Example 20 |
|---|---|---|---|---|
| Second hard coat layer | Composition | A | — | A |
|  | Thickness (μm) | 2 |  | 10 |
| First hard coat layer | Composition | 1 | 1 | 1 |
|  | Thickness (μm) | 10 | 3 | 2 |
| Hardened layer | Type | a | a | a |
|  | Thickness (μm) | 2 | 2 | 2 |
| Substrate film | Type | Polyimide 1 | Polyimide 1 | Polyimide 1 |
|  | Thickness (μm) | 30 | 30 | 30 |

Examples 43 to 56, Comparative Example 17, and Reference Examples 14 to 20

Layered bodies were produced in the same manner as in Example 1 except for changing so as to have the composition and thicknesses shown in Table 5.

In addition, a composition a for a cured layer of a monofunctional monomer having a composition described later was applied onto one surface of the substrate film to form an applied film, and the formed applied film was heated at 70° C. for 1 minute to vaporize a solvent in the applied film. Using a UV irradiation apparatus (manufactured by Fusion UV Systems Japan; light source, H bulb), the applied film was irradiated with ultraviolet rays in the air so that a cumulative light quantity was 100 mJ/cm² to half-cure the applied film, and thereby a cured layer of a monofunctional monomer with a thickness shown in Table 5 was formed.
(Composition a for a Cured Layer of a Monofunctional Monomer)
Acryloyl morpholine (ACMO, manufactured by KOHJIN Film & Chemicals Co., Ltd.) 100 parts by mass
Photo-polymerization initiator (IRGACURE 184) 4 parts by mass
Fluorine leveling agent (F568, manufactured by DIC CORPORATION) 0.1 part by mass (in terms of solid)
Solvent (MIRK) 75 parts by mass
Solvent (MEK) 75 parts by mass
Compositions b and c for a cured layer used in Reference Examples 16 and 17 have the following composition.
(Composition b for a Cured Layer)
Difunctional acrylate monomer (M240 manufactured by Toagosei Co., Ltd.) 100 parts by mass
Photo-polymerization initiator (IRGACURE 184) 4 parts by mass
Fluorine leveling agent (F568, manufactured by DIC CORPORATION) 0.1 part by mass (in terms of solid)
Solvent (MIBK) 75 parts by mass
Solvent (MEK) 75 parts by mass
(Composition c for a Cured Layer)
Trifunctional acrylate (PET-30, manufactured by Nippon Kayaku Co., Ltd.) 100 parts by mass Photo-polymerization initiator (IRGACURE 184) 4 parts by mass
Fluorine leveling agent (F568, manufactured by DIC CORPORATION) 0.1 part by mass (in terms of solid)
Solvent (MIBK) 75 parts by mass
Solvent (MEK) 75 parts by mass The layered bodies obtained in Examples, Comparative Examples and Reference Examples were evaluated in the same manner as in Example 1 concerning the folding-durable test, the pencil hardness and the steel wool (SW) resistance, and moreover, the following anti-interference fringe test was performed. Evaluation results are shown in Table 6.

(Anti-Interference Fringe Test)

With respect to each of the layered bodies of Examples, Comparative Examples and Reference Examples, a black tape (manufactured by TERAOKA SEISAKUSHO CO., LTD.) was bonded to a surface opposite to the side of the substrate film having the cured resin layer provided thereon. Then, using a spectrophotometer (MPC3100, manufactured by SHIMADZU Corp.), a surface on the side of the substrate film having the cured resin layer provided thereon was irradiated with light having an incident angle of 5 degrees, and reflected light in a specular direction which was reflected on a film was received to measure reflectances in a wavelength range of 380 nm to 780 nm, and then measured data in the wavelength range of 400 nm to 700 nm was approximated by a second-order polynomial, and a standard deviation was calculated from a difference between the measured value and an approximate value by the second-order polynomial in an arbitrary range of 50 nm.

Thereafter, a standard deviation of a wavelength range of 50 nm which has the largest standard deviation in the wavelength range of 400 nm to 700 nm was determined.

Further, with respect to each of the layered bodies of Examples, Comparative Examples and Reference Examples, a black tape (manufactured by TERAOKA SEISAKUSHO CO., LTD.) was bonded to a surface opposite to the side of the substrate film having the cured resin layer provided thereon, and then the presence or absence of the interference fringe was visually checked under three-wavelength tube fluorescent lamp.

+: An interference fringe cannot be found

−: An interference fringe is found

TABLE 6

|  | Example 43 | Example 44 | Example 45 | Example 46 | Example 47 | Example 48 | Example 49 | Example 50 |
|---|---|---|---|---|---|---|---|---|
| Folding-durable test | + | + | + | + | + | + | + | + |
| Pencil hardness | 7H | 7H | 7H | 7H | 7H | 8H | 7H | 7H |
| SW resistance | + | + | + | + | + | + | + | + |
| Interference fringe | + | + | + | + | + | + | + | + |
| Standard deviation | 0.010 | 0.012 | 0.017 | 0.010 | 0.011 | 0.013 | 0.011 | 0.011 |

|  | Example 51 | Example 52 | Example 53 | Example 54 | Example 55 | Example 56 |
|---|---|---|---|---|---|---|
| Folding-durable test | + | + | + | + | + | + |
| Pencil hardness | 7H | 7H | 7H | 7H | 7H | 9H |
| SW resistance | + | + | + | + | + | + |
| Interference fringe | + | + | + | + | + | + |
| Standard deviation | 0.010 | 0.014 | 0.010 | 0.013 | 0.012 | 0.018 |

|  | Reference Example 14 | Reference Example 15 | Reference Example 16 | Reference Example 17 | Comaprative Example 17 | Reference Example 18 | Reference Example 19 | Reference Example 20 |
|---|---|---|---|---|---|---|---|---|
| Folding-durable test | + | + | + | + | − | +/− | +/− | +/− |
| Pencil hardness | 7H | 7H | 7H | 7H | 7H | 9H | 5H | 7H |
| SW resistance | + | + | + | + | + | + | − | + |
| Interference fringe | − | − | − | − | + | + | + | + |
| Standard deviation | 0.080 | 0.050 | 0.074 | 0.072 | 0.010 | 0.013 | 0.012 | 0.017 |

As shown in Table 6, the layered bodies of Examples 43 to 56 were excellent in the folding-durable performance, the pencil hardness and the abrasion-resistance.

Further, in the layered bodies of Examples, the interference fringe at a bending portion was not found even though layered bodies were folded, and a moving interference fringe resulting from folding was not observed.

On the other hand, the layered bodies of Reference Examples 14, 16 and 17 were inferior in the anti-interference fringe performance since the layered bodies did not have a cured layer of a monofunctional monomer. Further, in Reference Example 15, although the layered body had the monofunctional monomer layer, an interference fringe was observed since a thickness of the layer was large.

Further, the layered body of Comparative Example 17 was inferior in the folding-durable performance since adhesiveness between the first hard coat layer and the second hard coat layer was poor.

Further, in the layered bodies of Reference Example 18 in which the first hard coat layer was too thick, Reference Example 19 in which the second hard coat layer was not formed, and Reference Example 20 in which the second hard coat layer was too thick, although cracks were not produced by folding the layered body with a backside facing outward in the folding-durable test, cracks were produced by folding the layered body with the surface facing outward. Further, Reference Example 19 in which the second hard coat layer was not formed was also inferior in the abrasion-resistance.

Further, in the layered bodies of Reference Examples 18 to 20, since a cured layer of a monofunctional monomer was suitably formed, the interference fringe at a bending portion was not found even though layered bodies were folded, and a moving interference fringe resulting from folding was not observed.

TABLE 7

|  |  | Example 57 | Example 58 | Example 59 | Example 60 | Example 61 | Example 62 | Example 63 | Example 64 | Example 65 | Example 66 |
|---|---|---|---|---|---|---|---|---|---|---|---|
| Second hard coat layer | Composition | A | A | A | A | A | B | C | D | E | A |
|  | Thickness (μm) | 2 | 4 | 2 | 0.75 | 2 | 2 | 2 | 2 | 2 | 2 |
| First hard coat layer | Composition | 1 | 1 | 1 | 1 | 1 | 2 | 3 | 4 | 5 | 1 |
|  | Thickness (μm) | 3 | 3 | 5 | 3 | 2 | 3 | 3 | 3 | 3 | 3 |
| Substrate film | Type | Polyimide 1 | Polyimide 1 | Polyimide 1 | Polyimide 1 | Polyimide 1 | Polyimide 1 | Polyimide 1 | Polyimide 1 | Polyimide 1 | Polyimide 1 |
|  | Thickness (μm) | 30 | 30 | 30 | 30 | 30 | 30 | 30 | 30 | 30 | 50 |

|  |  | Example 67 | Example 68 | Example 69 | Example 70 | Example 71 | Example 72 | Example 73 |
|---|---|---|---|---|---|---|---|---|
| Second hard coat layer | Composition | A | A | A | A | A | A | A |
|  | Thickness (μm) | 4 | 2 | 2 | 2 | 2 | 2 | 2 |
| First hard coat layer | Composition | 1 | 1 | 1 | 1 | 1 | 1 | 1 |
|  | Thickness (μm) | 5 | 3 | 3 | 3 | 3 | 3 | 3 |
| Substrate film | Type | Polyimide 1 | Polyimide 1 | Polyimide 2 | Polyimide 3 | Polyimide 8 | Polyimide 9 | Ararmid 20 |
|  | Thickness (μm) | 50 | 20 | 30 | 30 | 30 | 30 | 30 |

|  |  | Reference Example 21 | Reference Example 22 | Reference Example 23 | Reference Example 24 | Comparative Example 18 | Reference Example 25 | Reference Example 26 | Reference Example 27 | Reference Example 28 | Reference Example 28 |
|---|---|---|---|---|---|---|---|---|---|---|---|
| Second hard coat layer | Composition | A | A | A | A | A | A | — | A | A | A |
|  | Thickness (μm) | 2 | 2 | 2 | 2 | 2 | 2 | — | 10 | 4 | 3 |

TABLE 7-continued

|  |  |  |  |  |  |  |  |  |  |  |  |
|---|---|---|---|---|---|---|---|---|---|---|---|
| First hard coat layer | Composition | 1 | 1 | 1 | 1 | 1 | 1 | 1 | 1 | 1 | — |
|  | Thickness (μm) | 3 | 3 | 3 | 3 | 3 | 10 | 3 | 2 | 5 | — |
| Substrate film | Type | TAC | PET | PEN | COP | Polyimide 1 | Polyimide 1 | Polyimide 1 | Polyimide 1 | Polyimide 1 | Polyimide 1 |
|  | Thickness (μm) | 25 | 50 | 30 | 25 | 30 | 30 | 30 | 30 | 100 | 30 |

Examples 57 to 73, Comparative Example 18, and Reference Examples 21 to 28

Layered bodies were produced in the same manner as in Example 1 except for changing so as to have the composition and thicknesses shown in Table 7.

The layered bodies obtained in Examples, Comparative Examples and Reference Examples were evaluated in the same manner as in Example 1 concerning the folding-durable test, the pencil hardness and the steel wool resistance, and moreover, the following total light transmittance test was performed. Evaluation results are shown in Table 8.

(Total Light Transmittance)

The total light transmittance (%) was measured according to JIS K 7361 using a haze meter (manufactured by MURAKAMI COLOR RESEARCH LABORATORY; product number, HM-150)

since adhesiveness between the first hard coat layer and the second hard coat layer was poor.

Further, in the layered bodies of Reference Example 25 in which the first hard coat layer was too thick, Reference Example 26 in which the second hard coat layer was not formed, Reference Example 27 in which the second hard coat layer was too thick and Reference Example 28 in which the substrate film was too thick, although cracks were not produced by folding the layered body with a backside facing outward in the folding-durable test, cracks were produced by folding the layered body with the surface facing outward.

Further, Reference Example 26 in which the second hard coat layer was not formed was also inferior in the abrasion-resistance.

Further, Reference Example 28 in which the first hard coat layer was not formed was inferior in the pencil hardness.

TABLE 8

|  | Example 57 | Example 58 | Example 59 | Example 60 | Example 61 | Example 62 | Example 63 | Example 64 | Example 65 |
|---|---|---|---|---|---|---|---|---|---|
| Folding-durable test | + | + | + | + | + | + | + | + | + |
| Pencil hardness | 7H | 8H | 7H | 7H | 7H | 7H | 7H | 7H | 7H |
| SW resistance | + | + | + | + | + | + | + | + | + |
| Total light transmittance (%) | 90 | 90 | 90 | 90 | 90 | 90 | 90 | 90 | 90 |

|  | Example 66 | Example 67 | Example 68 | Example 69 | Example 70 | Example 71 | Example 72 | Example 73 |
|---|---|---|---|---|---|---|---|---|
| Folding-durable test | + | + | + | + | + | + | + | + |
| Pencil hardness | 8H | 9H | 6H | 5H | 5H | 5H | 5H | 5H |
| SW resistance | + | + | + | + | + | + | + | + |
| Total light transmittance (%) | 89 | 90 | 91 | 90 | 90 | 90 | 90 | 89 |

|  | Reference Example 21 | Reference Example 22 | Reference Example 23 | Reference Example 24 | Comparative Example 18 | Reference Example 25 | Reference Example 26 | Reference Example 27 | Reference Example 28 | Reference Example 28 |
|---|---|---|---|---|---|---|---|---|---|---|
| Folding-durable test | + | + | + | + | − | +/− | +/− | +/− | +/− | + |
| Pencil hardness | 3H | 3H | 4H | B | 7H | 9H | 5H | 7H | 9H | 4H |
| SW resistance | + | + | + | + | + | + | − | + | + | + |
| Total light transmittance (%) | 92 | 91 | 90 | 92 | 90 | 90 | 90 | 90 | 90 | 87 |

As shown in Table 8, the layered bodies of Examples 57 to 73 were excellent in the folding-durable performance, the abrasion-resistance and the transparency and had the extremely excellent pencil hardness of 5H or higher.

Further, in the layered bodies of any Examples, their cross-sections were observed with a microscope, and consequently elution of the material components of the substrate film into the first hard coat layer was recognized.

On the other hand, the layered bodies of Reference Examples 21 to 24, which did not use a polyimide film or an aramid film as the substrate film, were inferior in pencil hardness, and cross-sections thereof was observed with a microscope, and consequently elution of a material component of the substrate film into the first hard coat layer was not found.

Further, the organic EL layered body of Comparative Example 18 was inferior in the folding-durable performance In addition, the case in which the layered bodies obtained in Examples, Comparative Examples and Reference Examples were laminated on a commercially available organic EL layer to form layered bodies for organic ELs in which a layered body is laminated on one surface of the organic EL layer, results were the same as the above-mentioned results.

The layered body of the present invention can be suitably used as a surface material of a folding type image display device.

REFERENCE SIGNS LIST

10 layered body of the present invention
11 upper fixed portion
12 lower fixed portion

The invention claimed is:

1. A layered body for an optical member,
the layered body being used as a surface material of an optical member,
the layered body comprising:
a substrate film; and
at least one cured resin layer,
the layered body being not cracked or fractured when a test in which the entire area of said layered body for an optical member is folded 180 degrees at 20 mm intervals is repeated 100,000 times, wherein
when spectral reflectivities of the layered body for an optical member in a wavelength region of 400 nm to 700 nm are determined, a standard deviation of the spectral reflectivity in an arbitrary range of 50 nm is less than 0.045.

2. The layered body for an optical member according to claim 1, wherein the layered body for an optical member is not cracked or fractured when a test in which the entire area of the layered body for an optical member is folded 180 degrees at 3 mm intervals is repeated 100,000 times.

3. The layered body for an optical member according to claim 1, wherein a hardness of a pencil hardness test (load of 1 kg) of the cured resin layer, specified in JIS K5600-5-4 (1999), is 4H or higher.

4. The layered body for an optical member according to claim 1, wherein the layered body for an optical member is not scuffed in a steel wool resistance test in which a surface of the cured resin layer is scrubbed to and fro 3500 times with #0000 steel wool under a load of 1 kg/cm$^2$.

5. The layered body for an optical member according to claim 1, wherein the substrate film is a polyethylene terephthalate film, a polyimide film, a triacetyl cellulose film, a polyethylene naphthalate film, a polyamide-imide film, a polyetherimide film, a polyetherketone film, a polyamide film, or an aramid film.

6. The layered body for an optical member according to claim 1, wherein a thickness of the substrate film is 10 to 100 μm.

7. The layered body for an optical member according to claim 1, further comprising a cured layer of a monofunctional monomer.

8. The layered body for an optical member according to claim 7, comprising the cured layer of a monofunctional monomer on a side of the cured resin layer of the substrate film.

9. The layered body for an optical member according to claim 1, wherein the cured resin layer has a first hard coat layer disposed on a surface of the substrate film opposite to the optical member, and a second hard coat layer disposed on a surface of said first hard coat layer opposite to said substrate film.

10. The layered body for an optical member according to claim 9, wherein
the second hard coat layer contains a cured product of a polyfunctional (meth)acrylate monomer as a resin component, and
the first hard coat layer contains a cured product of a polyfunctional (meth)acrylate as a resin component and silica fine particles dispersed in said resin component.

11. The layered body for an optical member according to claim 10, wherein the silica fine particles are reactive silica fine particles.

12. The layered body for an optical member according to claim 1, wherein the cured resin layer has a projection and depression shape on a surface opposite to the substrate film.

13. A foldable image display device formed by using the layered body for an optical member according to claim 1.

* * * * *